(12) United States Patent
Pedersen et al.

(10) Patent No.: US 7,379,001 B2
(45) Date of Patent: May 27, 2008

(54) SELF-OSCILLATING A/D-CONVERTER

(75) Inventors: Kim Rishøj Pedersen, Egå (DK); Lars Arknæs-Pedersen, Viby J (DK)

(73) Assignee: TC Electric A/S (DK)

( * ) Notice: Subject to any disclaimer, the term of this patent is extended or adjusted under 35 U.S.C. 154(b) by 0 days.

(21) Appl. No.: 10/573,059

(22) PCT Filed: Sep. 22, 2003

(86) PCT No.: PCT/DK03/00613

§ 371 (c)(1),
(2), (4) Date: Mar. 22, 2006

(87) PCT Pub. No.: WO2005/029707

PCT Pub. Date: Mar. 31, 2005

(65) Prior Publication Data

US 2007/0040721 A1 Feb. 22, 2007

(51) Int. Cl.
H03M 3/00 (2006.01)
(52) U.S. Cl. .................... 341/143; 341/155
(58) Field of Classification Search ........ 341/143, 341/155, 110, 144, 166
See application file for complete search history.

(56) References Cited

U.S. PATENT DOCUMENTS 4,768,018 A * 8/1988 Noujaim .............. 341/143
5,204,635 A 4/1993 Takeuchi
5,245,343 A * 9/1993 Greenwood et al. ........ 341/143
6,232,902 B1 * 5/2001 Wada .................... 341/143
6,674,387 B1 1/2004 Ott

FOREIGN PATENT DOCUMENTS

| DE | 36 42 360 | 6/1988 |
|---|---|---|
| DE | 101 28 942 | 1/2003 |
| WO | WO 02 25357 | 3/2002 |
| WO | WO 2005/029708 | 3/2005 |

OTHER PUBLICATIONS

International Search Report; PCT/DK03/00613; Apr. 13, 2004.
Faramarz Sabouri, et al.; "A High-Performance Calibration-Free Charge-Balancing Analog-to-Digital Converter"; IEEE Transactions on Instrumentation and Measurement, vol. 45, No. 5, Oct. 1996; XP000631687.

* cited by examiner

Primary Examiner—Brian Young
(74) Attorney, Agent, or Firm—Cantor Colburn LLP

(57) ABSTRACT

The invention relates to at least one self-oscillating loop (SOL) comprising at least one forward path (FP), at least one feedback path (FBP) wherein said at least one forward path (FP) comprises amplitude quantizing means (AQM) combined with time quantizing means (TQM) and outputting at least one time and amplitude quantized signal (OS). According to the invention, a high-speed high-resolution A/D converter may be obtained.

14 Claims, 18 Drawing Sheets

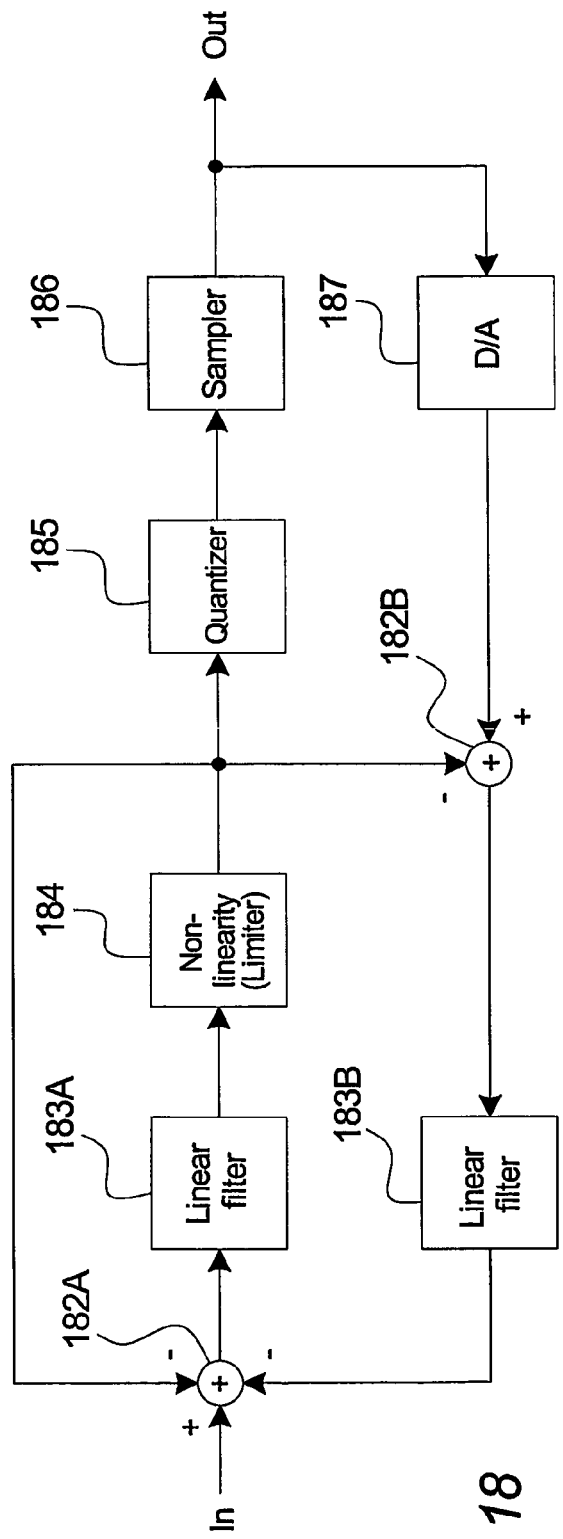
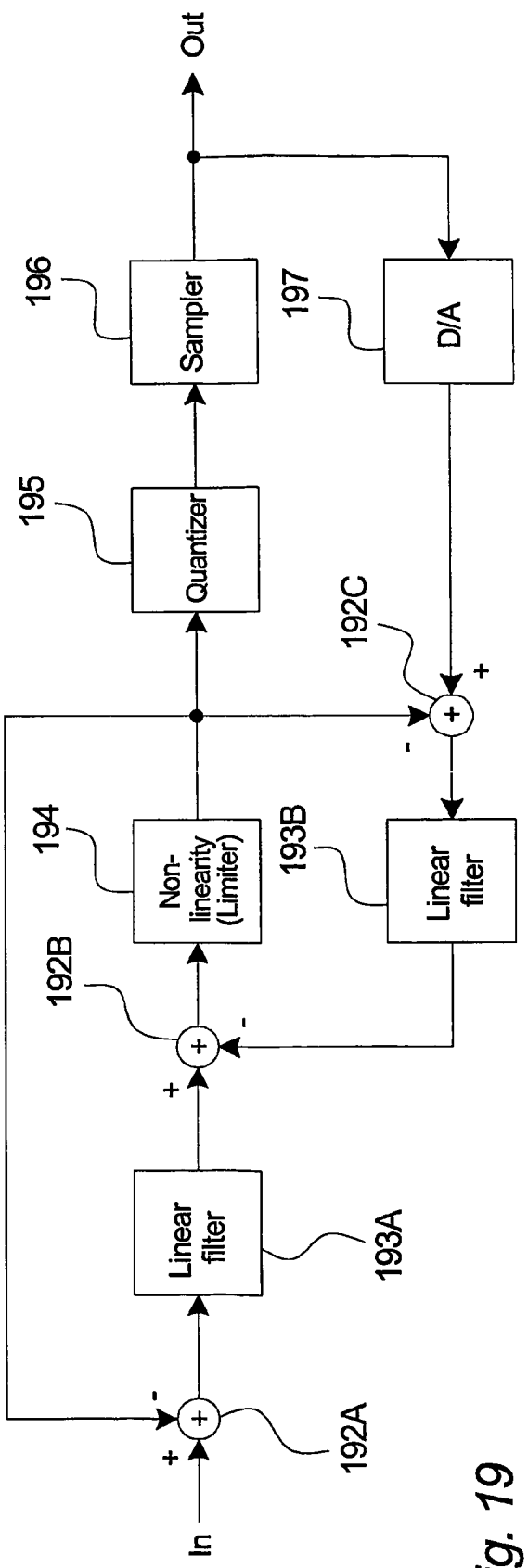
Fig. 18
Fig. 19

SELF-OSCILLATING A/D-CONVERTER

FIELD OF THE INVENTION

The invention relates to an A/D-converter according to the independent claim 1

DESCRIPTION OF RELATED ART

Over the recent years, so-called self-oscillating modulators have become the object of extensive research. Self-oscillating modulators have among many names been referred to in the art as controlled oscillating modulators. The use of such self-oscillating modulators have, however, been relatively limited due to the fact that performance of the modulators has been somehow restricted, thereby reducing the potential market to low-end applications. Others refer to self-oscillating modulators as controlled oscillating modulators.

BRIEF SUMMARY OF THE INVENTION

The invention relates to an A/D converter comprising a self-oscillating modulator, said converter comprising at least one self-oscillating loop again comprising at least one forward path and at least one feedback path, wherein said at least one forward path comprises amplitude quantizing means combined with time quantizing means and outputting at least one time and amplitude quantized signal.

According to the invention, a high-speed high resolution A/D converter may be obtained due to the fact that an advantageous pulse width modulation is facilitated by the at least one self-oscillating loop. It should be noted that the forward path FP broadly refers to a forward path, e.g. not only including the forward path of a closed feedback loop. Thus, e.g. time quantizing means may be cascaded with amplitude quantizing means externally to the loop.

According to the invention, a combined amplitude and time quantized signal is understood as a hybrid representation partly established as the traditional amplitude quantizing combined with a further quantizing in the time domain. This quantizing may also be referred to as a two-dimensional quantizing. In this context it should be noted that an amplitude quantized signal may also include a PWM two-level signal in the sense that the two levels may be regarded as two amplitude quantized levels suitable for establishment of the desired value when combined with a time-quantized signal.

According to a preferred embodiment of the invention, the time-quantization should divide the time axis over a PWM-period in at least 10, preferably at least 100 time-subintervals.

In an embodiment of the invention, said time quantizing means is arranged within said self-oscillating loop.

According to a preferred embodiment of the invention, said time and amplitude quantizing means are included in the feedback loop of a least one self-oscillating loop. In this way, the accuracy of the time quantizing may be improved significantly in a given frequency band compared to what in fact should be expected based on the known properties of an available time quantizer, such as a one-bit sampler. Thus, the available time resolution in the time domain may in fact be improved significantly in the sense that the self-oscillating loop suppresses both intrinsic noise and even quantizing noise when the time quantizer is included in the forward path of a self-oscillating loop. An example of the above-described circuit is illustrated in FIG. 8a.

In an embodiment of the invention, said time quantizing means comprises a high-speed sampling means.

According to a preferred embodiment of the invention, the time quantizing means comprises an e.g. 50-200 MHz sampler although higher frequencies may of course be applied. Evidently, according to the invention, a high time-resolution is preferred in order to increase the effective resolution as much as possible.

In an embodiment of the invention, said time quantizing means comprises a high-speed one-bit sampler.

According to a preferred embodiment of the invention, a high-speed one-bit sampler may comprise e.g. a simple latch sampling e.g. at a frequency of 50 to 200 MHz.

In an embodiment of the invention said time quantizing means comprises latch-based circuitry comprising at least one latch, preferably at least two cascaded latches.

It has been recognized that a time quantizer comprising at least two cascaded latches improves the desired performance of the time-quantizer by avoiding non-defined regions.

In an embodiment of the invention, said amplitude quantizing means and said time quantizing means comprises a multi-bit A/D converter and where said feedback path comprises at least one D/A converter adapted for converting said time quantized signal into an analogue signal.

According to an embodiment of the invention, the time-quantized output signal may be established by multi-bit A/D converter. In this way a more detailed digitized expression of the analogue signal may be established. Moreover, in order to facilitate the self-oscillating properties of loop, this multi-bit representation may of course be converted into an analogue signal, which may be fed back to the input of the forward path.

In an embodiment of the invention said down sampling means are connected to said time quantizing means.

According to an embodiment of the invention, said down sampling means may both be directly coupled to said time quantizing and coupled via further circuitry.

In an embodiment of the invention said A/D converter comprises two or more self-oscillating loops (SOL).

According to an embodiment of the invention, multiple self-oscillating may be applied e.g. for improvement of noise suppression, etc.

In an embodiment of the invention said amplitude time quantizing means comprises an analogue two-level self-oscillating pulse width modulator.

In an embodiment of the invention said amplitude time quantizing means comprises a multi-level self-oscillating pulse width modulator.

In an embodiment of the invention said A/D converter is single-ended.

In an embodiment of the invention said A/D converter is differential.

In an embodiment of the invention said A/D converter comprises filtering means, said filtering means adapted for band pass filtering the time quantized signal.

In an embodiment of the invention the error originating from at least one time quantizer included in the at least one self-oscillating loop of the converter is suppressed by an error transfer function which, at low frequencies approximates the inverse of the open-loop transfer function of said at least one self-oscillating loop.

According to the specific context of the invention, low frequencies may be regarded as frequencies well below the switch frequency. A precondition for obtaining the desired noise transfer function is that $|H(S)|>>1$ at low frequencies and at least on the utility band.

In an embodiment of the invention the error originating from at least one time quantizer included in the at least one self-oscillating loop of the converter is suppressed by an error transfer function which, at high frequencies approximates 0 dB.

According to the specific context of the invention, high frequencies may be regarded as frequencies significantly above the switch frequency.

In an embodiment of the invention said amplitude quantizing means comprises a limiter.

According to an embodiment of the invention several different limiters nay be applied for the purpose of obtaining the desired combination of modulation and oscillation.

In an embodiment of the invention said amplitude quantizing means comprises a frequency compensated limiter.

According to an advantageous embodiment frequency compensation may be applied. In this context, frequency compensation is regarded as a compensation inserted in the self-oscillating loop(s) or simple affecting the self- oscillation loop(s) to maintain a steady switch frequency.

In an embodiment of the invention a variable self-oscillating loop delay is applied.

By applying a variable delay in the self-oscillating loop a steady switch oscillation frequency may be obtained.

In an embodiment of the invention a variable delay in the feedback path.

By applying a variable delay in the feedback path a steady switch oscillation frequency may be obtained.

In an embodiment of the invention a transfer function H(s) is inserted in the forward path, thereby at least partly controlling the switch-frequency.

Evidently, according to further embodiments of the invention, further filters may be applied, e.g. forming path of at least one feed-back path of the self-oscillating circuitry.

Moreover, the invention relates to a method of performing a A/D-conversion comprising the steps of representing a pulse width modulated representation as an analogue signal and quantizing the pulse width modulation in the time-domain.

In an embodiment of the invention, said pulse width modulated representation is obtained by means of at least one self-oscillating modulator comprising at least one self-oscillating loop.

In an embodiment of the invention, said quantization in the time domain is performed within said at least one self-oscillating loop.

In an embodiment of the invention said method is applied in an A/D converter according to any of the claims 1-14.

BRIEF DESCRIPTION OF THE DRAWINGS

The invention will be described below with reference to the figures where

FIG. 18 illustrates a further embodiment of the invention where the time-quantizing error is fed back to the amplitude self-oscillating loop, FIG. 19 illustrates a further topology of feeding the time-quantizing error back to the amplitude self-oscillating loop.

DETAILED DESCRIPTION OF THE INVENTION

Self-oscillating modulators have found some use over the recent years, but the use of such modulation techniques has up until now been restricted to relatively few market segments.

Examples of such self-oscillating modulators are WO 00/42702, WO 02/25357, WO 02/093973, U.S. Pat. No. 6,118,336, WO 98/19391, WO 00/27028, U.S. Pat. No. 6,249,182 hereby included by reference with respect to different basic principles regarding the establishment and controlling of the desired oscillation in combination with the desired modulation. It is noted that according to the invention it is generally preferred to apply a relatively high switch frequency in order to obtain not only the desired oscillation but also very powerful noise suppression obtained by the broad banded feedback path(s) of the self-oscillating modulator.

Figure 1:
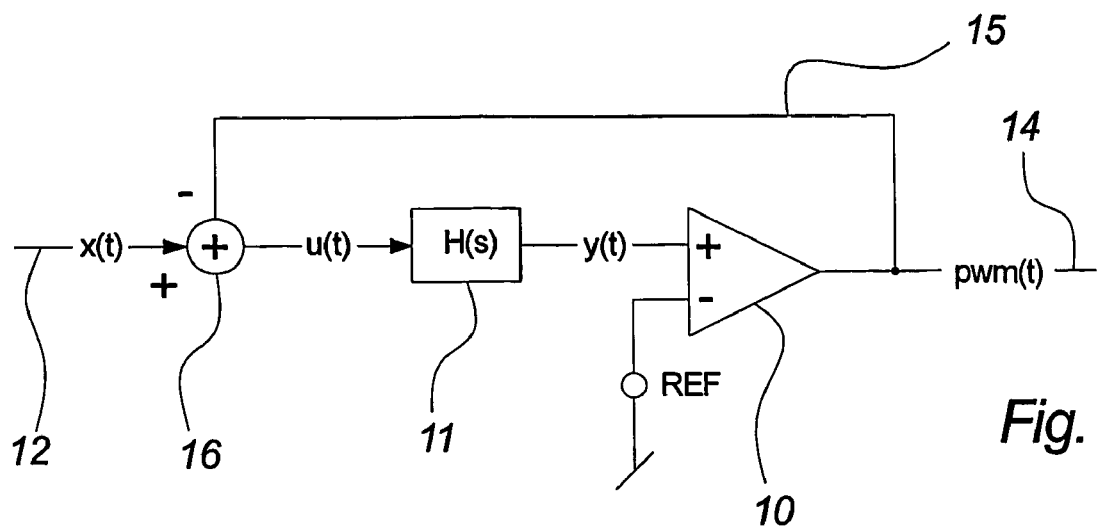
FIG. 1 illustrates a self-oscillating pulse width modulator.

FIG. 1 illustrates an example of such a self-oscillating pulse width modulator.

From the beginning it should be noted that PWM in this context covers several different types of variations, such as NPWM, LPWM, etc. The illustrated PWM modulator utilizes in a known way the very broad banded feedback as error attenuation combined with the PWM modulation of the input signal. Evidently, according to the invention, several other self-oscillating topologies may be applied within the scope of the invention with further signal paths. Basically, the illustrated circuit should rather be regarded as a principle model of a self-oscillating modulator.

The illustrated self-oscillating modulator comprises an input 12 guiding an input signal x(t) to a comparator 10 via a subtraction point 16 and compensating filtering means 11. The comparator 10 delivers an output pwm(t) on an output 14 of the circuit output. Moreover, this output is fed back to the subtraction point 16. The arranging of e.g. filtering means may be realized in several different ways, e.g. by inclusion of further filtering means e.g. in further (not shown) feedback or forward paths. Note that the illustrated embodiment features a comparator 10 having a variable voltage reference instead of a fixed grounding in order to keep the switch frequency within a certain desired switch-frequency interval independent or substantially independent of the frequencies of the input signal. The variable voltage reference may be established in many ways within the scope of the invention, e.g. on the basis of the amplitude of the input signal of the modulator. An example of one principle applied for this purpose is known from WO 00/42702, hereby included by reference.

Figure 2:
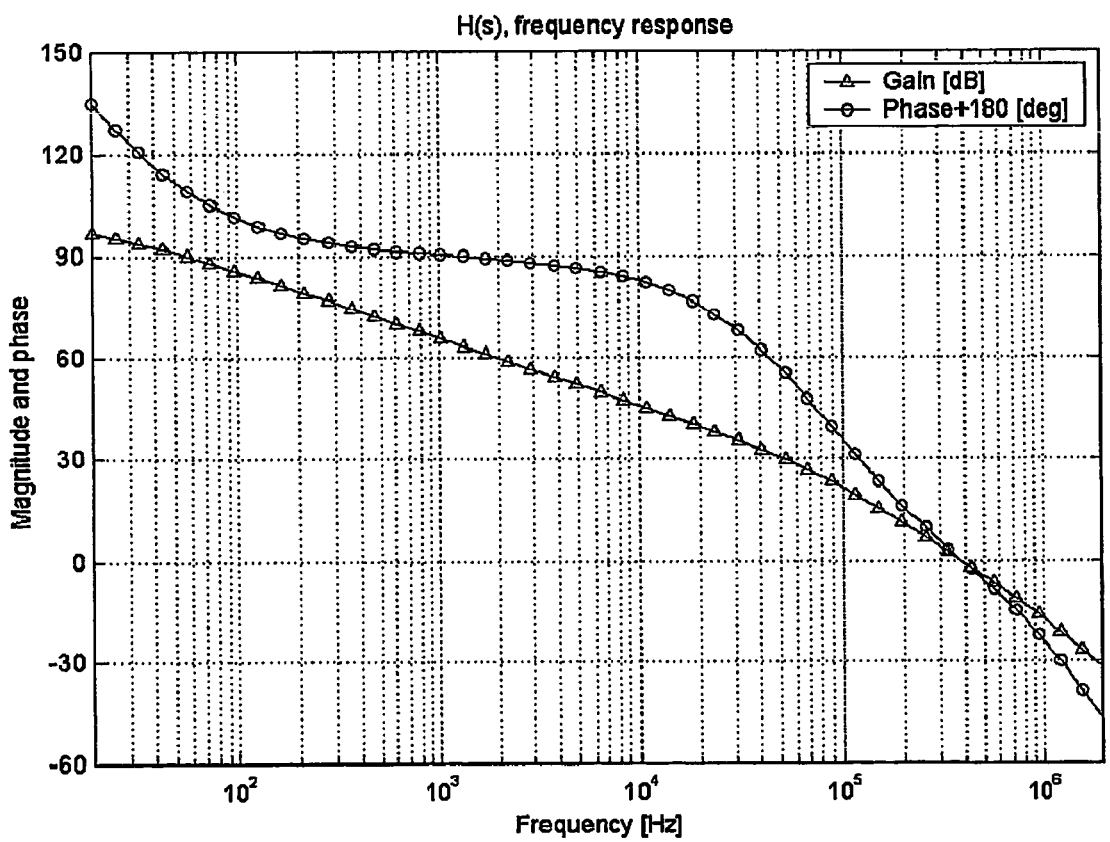
FIG. 2 illustrates filter characteristics of a pulse width modulator.

One way of looking at the modulator may be summed up: the open loop phase has to be approximately −180 degrees at the desired switch frequency. The comparator will provide the gain. An example of a suitable filter H(s) may be illustrated in FIG. 2 where the switch frequency is approximately 384 kHz.

Figure 3A:
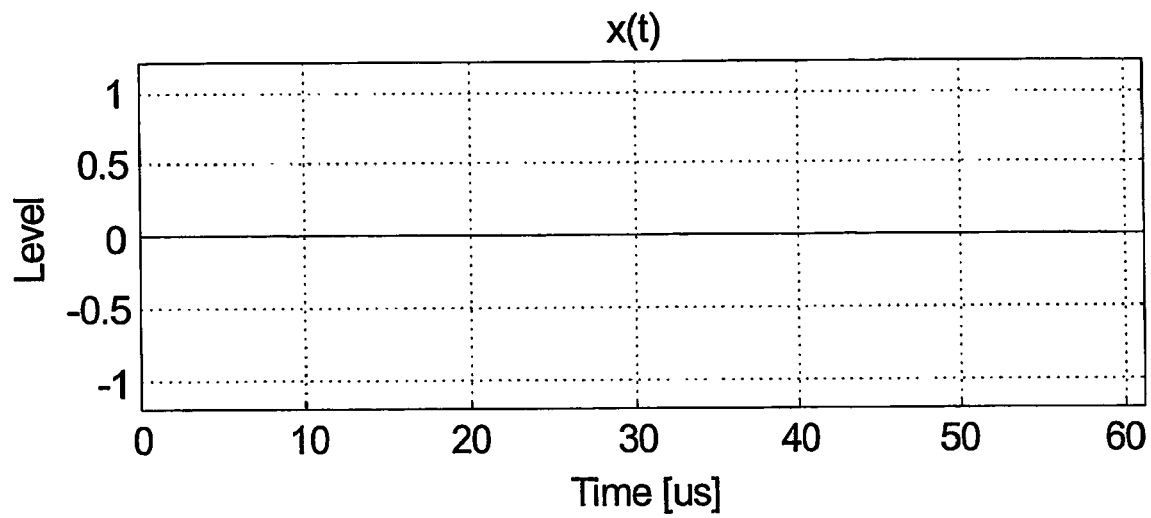
FIG. 3a and 3b illustrate a possible input and a resulting output of a pulse width modulator, respectively.
Figure 3B:
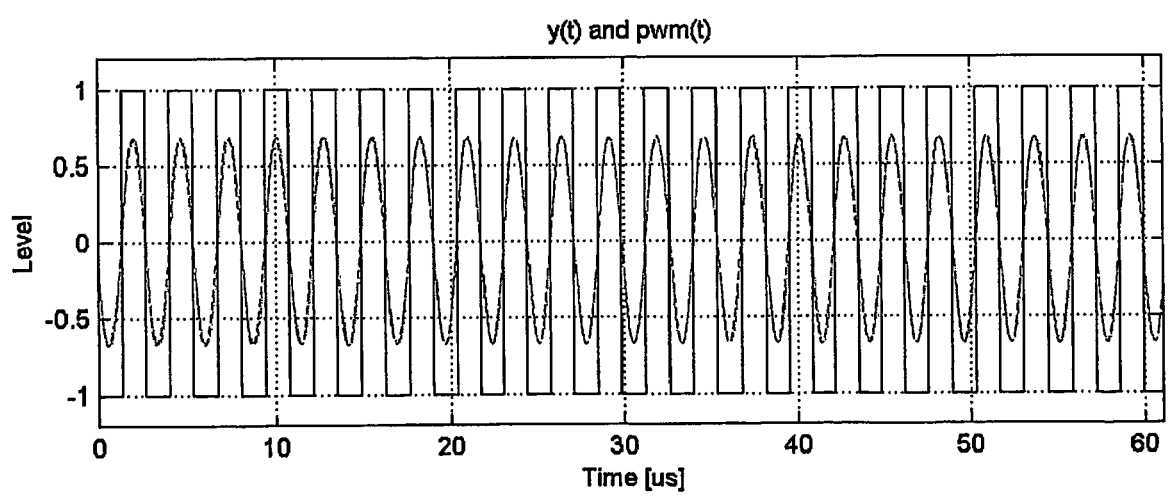

FIG. 3a and 3b illustrate a possible input and a resulting output of a PWM modulator, where FIG. 3a illustrates an exemplary input signal x(t)=0 and FIG. 3b illustrates the resulting output pwm(t) of the modulator.

Figure 4A:
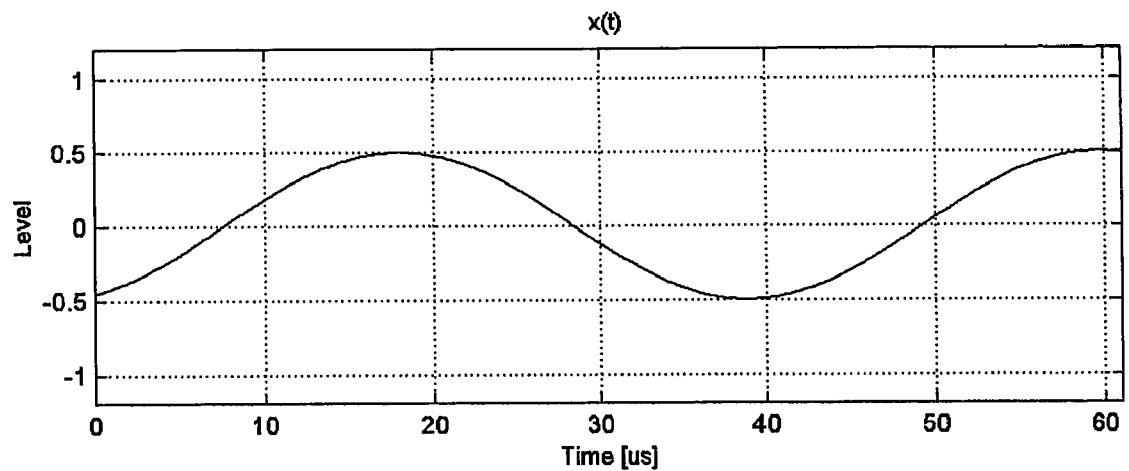
FIG. 4a and 4b illustrate a further possible input and a resulting output of a pulse width modulator, respectively.
Figure 4B:
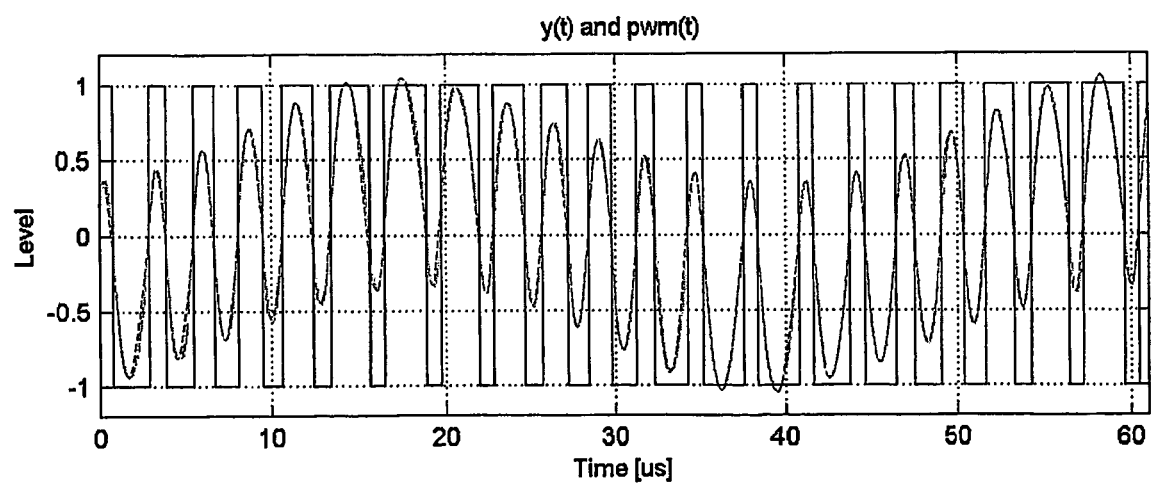

FIG. 4a and 4b illustrate a further possible input and a resulting output of a self-oscillating PWM modulator, where FIG. 3a illustrates an exemplary input sinusoidal signal of x(t)=20 kHz−6 dB and FIG. 4b illustrates the resulting output pwm(t) of the modulator.

It is noted that the oscillation in the self-oscillating embodiment illustrated in FIG. 4a is floating in the sense the switch signal is an overlay signal, which when combined with a threshold-triggered circuit, e.g. a comparator, will result in a desired modulation of the input signal, here a PWM-modulated signal.

Figure 5:
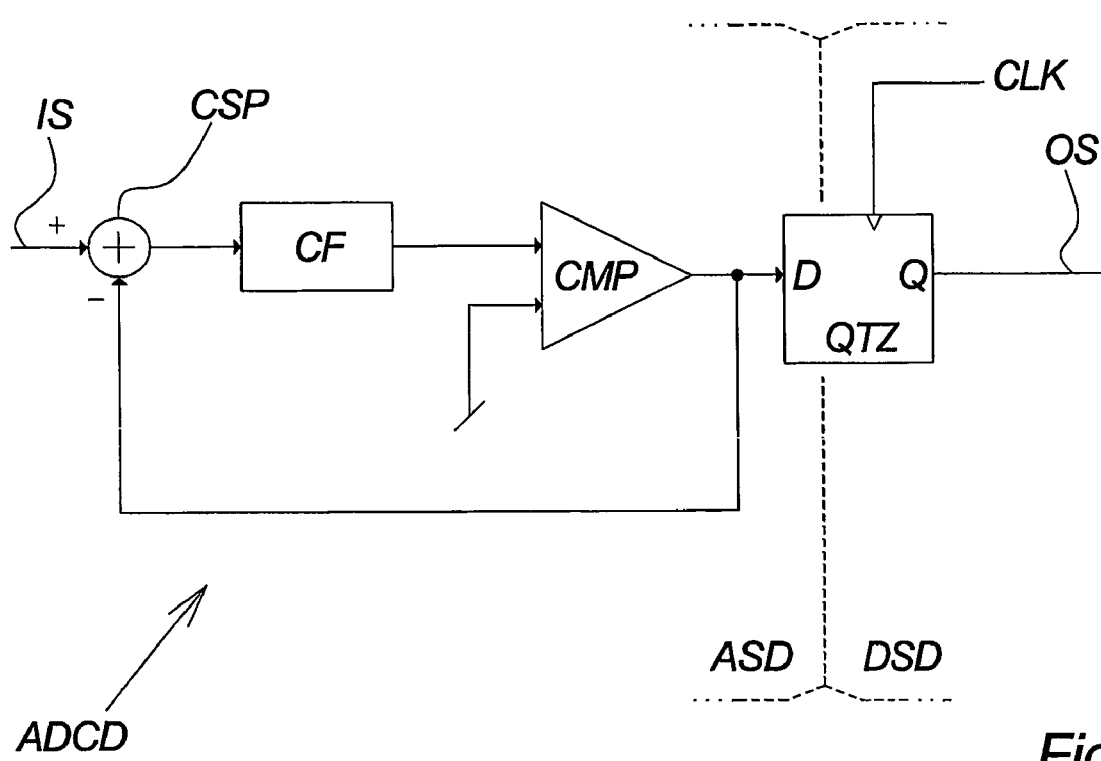
FIG. 5 illustrates self-oscillating modulator according to an embodiment of the invention.

FIG. 5 illustrates a self-oscillating A/D modulator, an A/D converter ADCD according to an embodiment of the invention.

The embodiment comprises an input by means of which an analogue input signal IS is fed to a comparator CMP via a filter CF and a subtraction point CSP. The output of the comparator CMP is fed to the input D of latch QTZ, which again delivers an output signal OS by means of an output Q. The output of the comparator QTZ is fed back to the subtraction point CSP and subtracted from the input signal IS from the input of the modulator.

Basically, the illustrated modulator, also referred to as A/D-converter, comprises two stages, a first self-oscillating stage comprising an analogue modulator, e.g. a self-oscillating PWM modulator and a second stage comprising an A/D sampler adapted for conversion of the signal received from the first stage into a stream of digital pulses. The task of the first stage is primarily to establish a modulated representation of an input signal IS. The modulated representation may according to the illustrated embodiment comprise a PWM signal. Several variations of techniques based on self-oscillation are suitable for establishing a modulated representation of an analogue input signal IS.

The established modulated signal, here: on the output of a comparator CMP may be regarded as an analogue modulated version of the input signal.

Another way of looking at the first stage is that an input signal is quantized on the basis of the amplitude of the input signal IS, here quantized in two amplitude levels, i.e. as a conventional PWM signal.

In the second stage the analogue signal may be converted to a digitally represented signal suitable for further digital signal processing. In the illustrated embodiment a conventional fast running latch QTZ is applied as a time quantizer and outputs a digital PWM signal.

Basically, the output signal OS of the second stage may be regarded as a PCM signal.

An advantage of the illustrated converter is basically that the first stage established a modulated version of the input signal by very simple and high-accuracy modulation by means of a self-oscillating modulator, and then, subsequently in a separate stage, transforms the obtained signal into a digitally represented signal and at the end establishing a signal quantized in two dimensions, time- and amplitude.

The distinction between the signals flowing in the two stages is illustrated by the dotted line, where the domain left to the line may be regarded as an analogue domain ASD and the domain right to the line may be regarded as a digital domain DSD.

Generally, within the scope of the invention, a time quantizer may comprise e.g. a latch, variants of a latch,— e.g. a cascaded double latch, relatively simple A/D converters, etc.

Figure 6A:
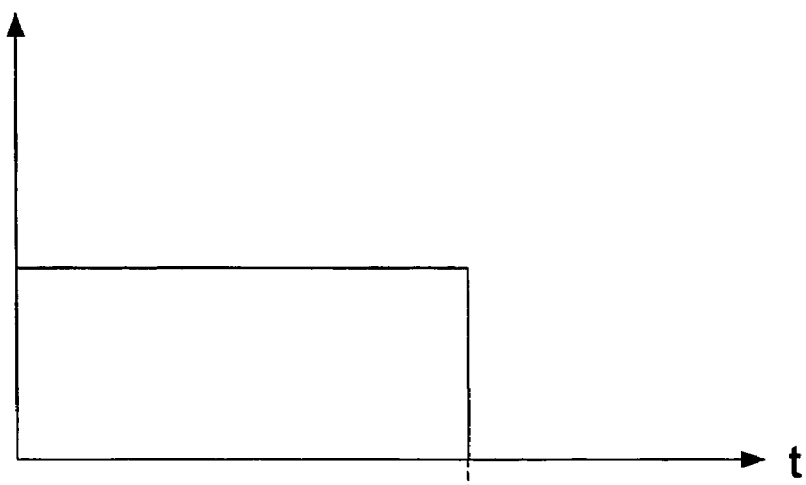
FIG. 6a and 6b illustrate the A/D conversion according to the embodiment of FIG. 5.
Figure 6B:
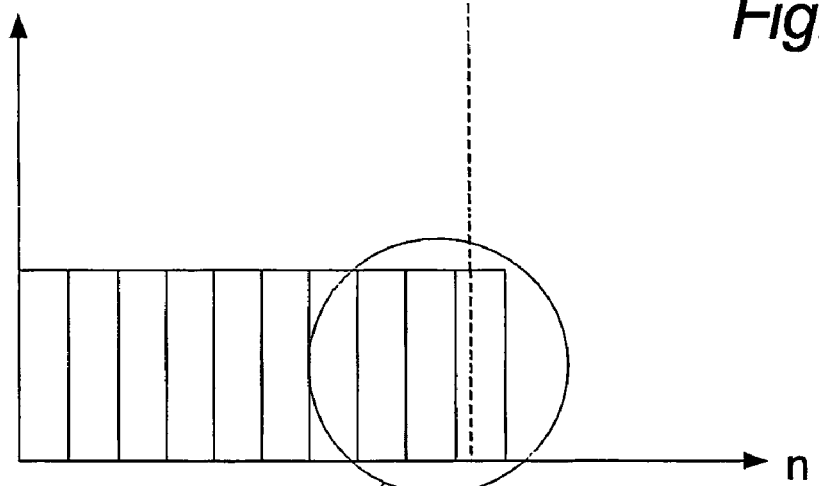
Figure 6B:
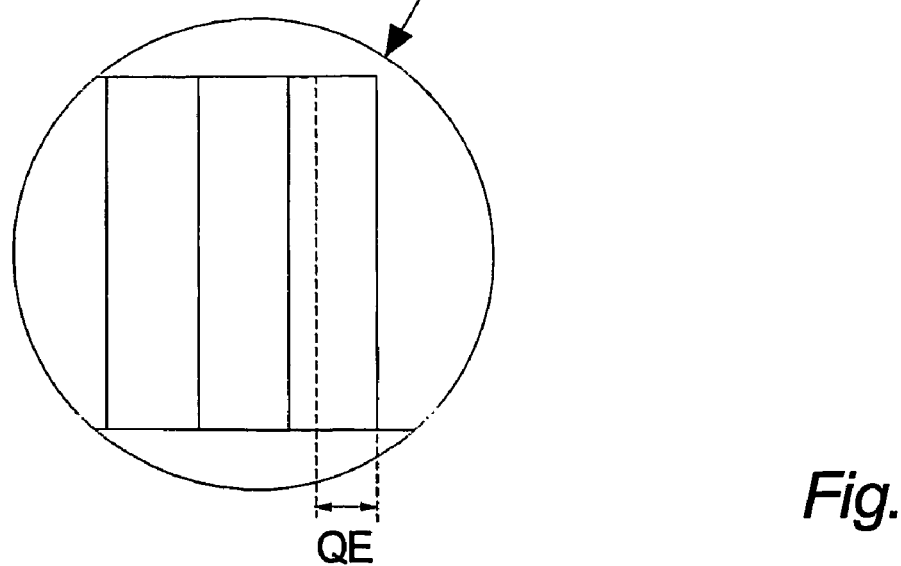

FIG. 6a and 6b illustrate the principles of A/D-conversion of a PWM signal, or a derivative of a PWM-signal, into a PCM signal. In FIG. 6a, an analogue PWM signal is provided, e.g. as present on the output of the comparator CMP of FIG. 5. The signal is then quantized with respect to the time axis T and a time quantized signal is obtained in FIG. 6b.

The resolution in time may differ from application to application, e.g. approximately be one hundred quantizing steps per period.

The quantized signal may be indexed immediately or preprocessed prior to indexing. One of several preprocessing techniques may e.g. imply different kinds of filtering, e.g. down sampling, in order to reduce the sample rate.

It is noted that the quantized signal in FIG. 6b is limited in resolution and inherits a quantizing error, QE, due to the in nature limited number of time-quantizing steps. This quantizing error may of course be minimized by increasing the number of time-quantizing steps per period. Alternatively, advanced noise-reduction algorithms may be applied.

The obtained signal illustrated with reference to the n-axis is according to the invention regarded as a combined amplitude and time-quantized signal in the sense that the y-axis represents two possible amplitude quantization levels, e.g. 1 and 0, and the time axis n represents a time-quantized digital representation. Thus, according to the invention, the obtained signal comprises a PWM-signal or derivative thereof quantized in two-dimensions, amplitude and time.

A further embodiment of the invention, which will be described in the following, comprises a multi-level PWM, where the quantization resolution has been increased compared to the illustrated two-level quantization.

Figure 8A:
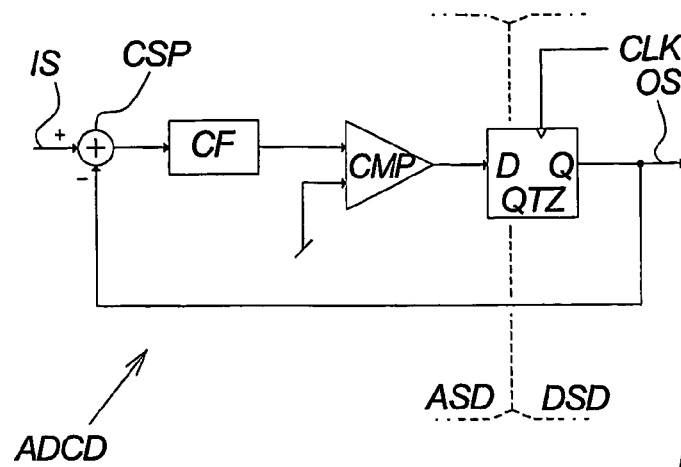
FIG. 8a-8c illustrates a further embodiment of the invention where the time quantizer is included in the self-oscillating loop.

According to a preferred embodiment of the invention, e.g. as illustrated in FIG. 8a, time-quantization error QE has been reduced by including the time quantization in the self-oscillating loop.

Figure 7:
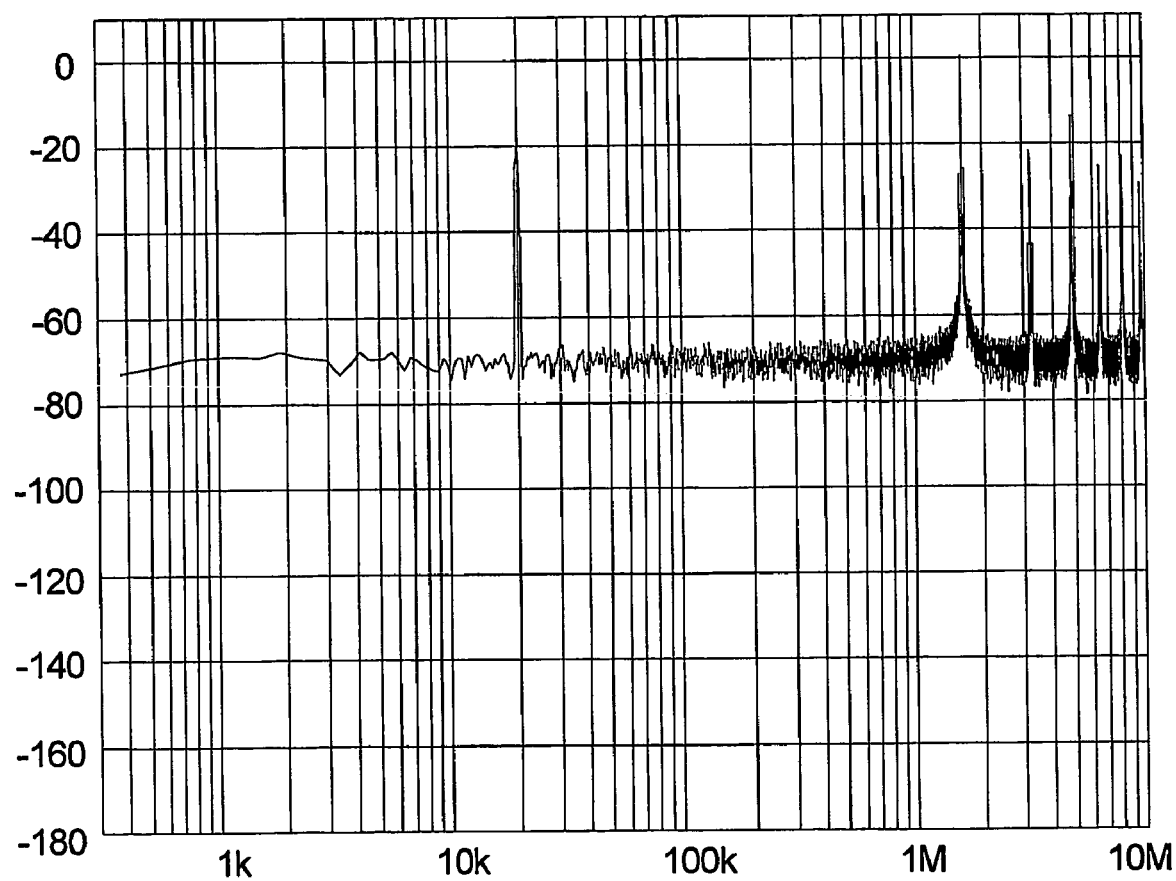
FIG. 7 illustrates the noise spectrum of a pulse width modulator according to the embodiment of FIG. 5 when applying a sinusoidal input.

FIG. 7 illustrates the noise spectrum of a PWM modulator according to the embodiment of FIG. 5 when applying a sinusoidal input as described with reference to FIG. 4a and 4b.

It is noted that the main noise spectrum is substantially white and that the noise primarily results from quantizing noise of the time quantizer, e.g. a latch, i.e. a one-bit sampler. It is further noted that the peaks occur at, obviously, −20 dB, 20 kHz, representing the input signal and further peaks occur at approximately n●$f_{switch}$, where $f_{switch}$ refers to the switch frequency, here approximately 1.6 MHz+ and n refer to a number 1, 2, 3, etc.

It is also noted that there is a noise floor at approximately −70 dB, which for several applications may be completely acceptable.

FIG. 8a illustrates a preferred embodiment of the invention where a time quantizer has been included in the self-oscillating loop.

In principle, the illustrated embodiment features both the amplitude quantizing and time quantizing means, but now coupled and interacting in a very sophisticated way. The embodiment comprises an input by means of which an analogue input signal IS is fed to a comparator CMP via a subtraction point CSP and a filter CF. The output of the comparator CMP is fed to the input D of latch QTZ, which again delivers an output signal OS by means of an output Q. This signal path is an example of the at least one forward path according to the terms applied for the purpose of describing the invention. The output of the latch QTZ is moreover fed back to the input of the subtraction point CSP and subtracted from the input signal IS on the input of the modulator. This signal path enabling this feedback is an example of the at least one feedback path referred to in the claims.

It is initially noted that the illustrative distinction between the analogue and the digital domain illustrated by the dotted line is somewhat more difficult to establish. A further explanation of the distinction between the digital and analogue domain is given in example FIG. 8b.

The basic difference between the above-illustrated embodiment in FIG. 5 and the present embodiment of the invention is that time quantizer in the form of the latch QTZ is now included in the self-oscillating loop. The inclusion of the time-quantizer in the self-oscillating part of the loop has some very important and significant advantages due to the fact that noise induced by the latch QTZ is suppressed by the feedback loop. This feature will be described in details below. The suppression of noise includes among other error components most significantly time-quantizing noise.

Although differing from the embodiment of FIG. 5, the available time resolution steps are still limited in number, e.g. about one hundred per period as explained in the above embodiment. However, now the time quantizer has been included in the feedback loop of the self-oscillator, thereby, averaging the time-quantized signal more truly to the inputted analogue signal. Evidently, such an improvement may suitably be exploited by the use of subsequent filtering, converting the time-quantized signals e.g. into a corresponding high-resolution amplitude encoded signal e.g. by low-pass filtering.

It is noted that an interesting feature of the illustrated embodiment of the invention is that no clear distinction between the analogue and digital domain may be made although the distinction is very clear. The feature results in a very simple establishment of a hybrid analogue/digital self-oscillating modulator, where the established digital output signal, i.e. here the output of the illustrated latch is branched both as an analogue signal directly fed back to the input of the modulator and from there forming part of a comparison between to basically analogue signals and as a digital output signal OS intended for further processing. The applied D/A-conversion is in principle performed by the hold-circuit of the latch.

Figure 8B:
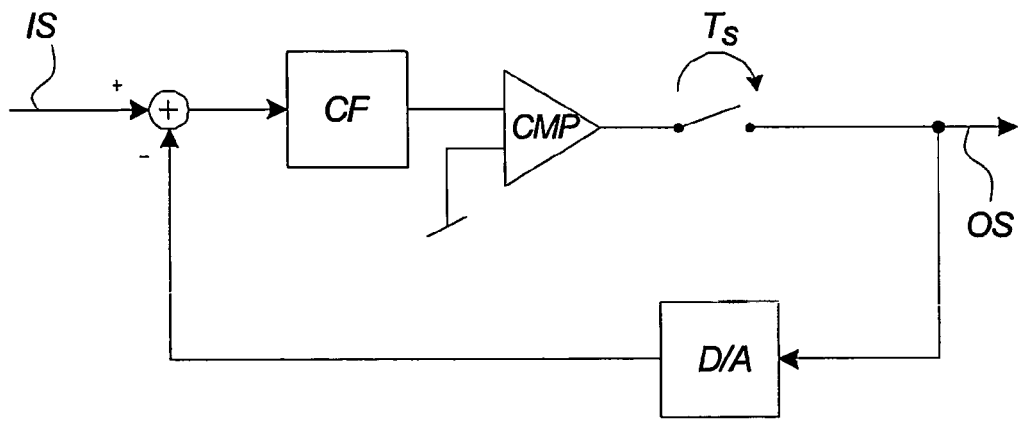

This feature is illustrated a little more detailed with reference to FIG. 8b illustrating in principle the same embodiment as FIG. 8a, but now pin-pointing the advantageous branching of both digital and an "analogue" signal on the output of a latch circuit.

Thus, FIG. 8b illustrates the branching of a digital output from the latch QTZ derived from the sampler as the digital output OS and the establishment of an analogue signal in the feedback path by means of a D/A converter, i.e. in the current embodiment the hold circuit of the latch.

Figure 8C:
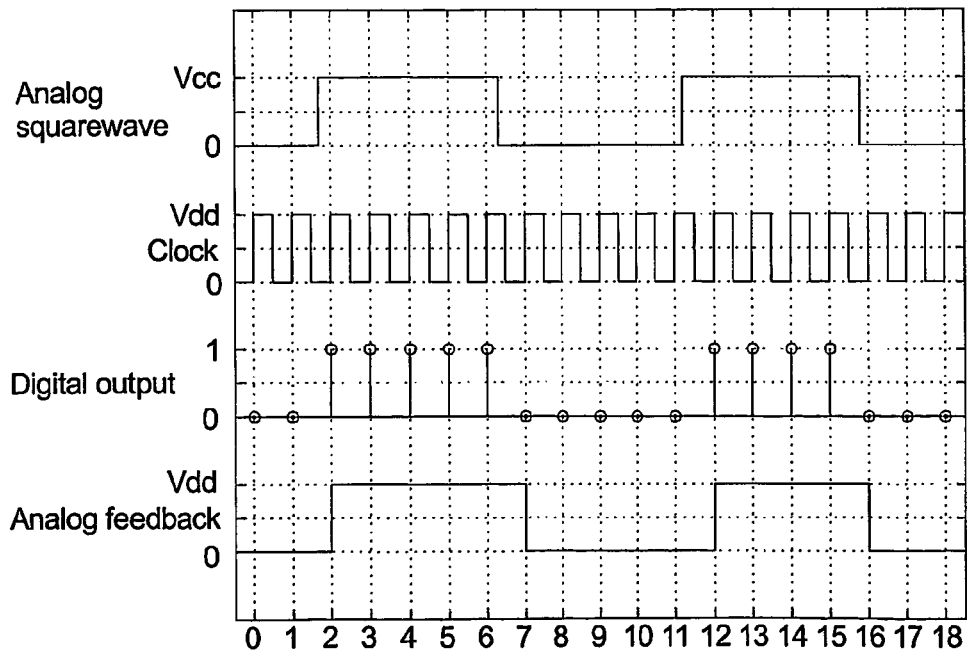

The functioning of the applied sample/hold latch is showed in FIG. 8c, illustrating the streaming and the character of the involved signals on the input and the output of the illustrated latch.

Figure 9:
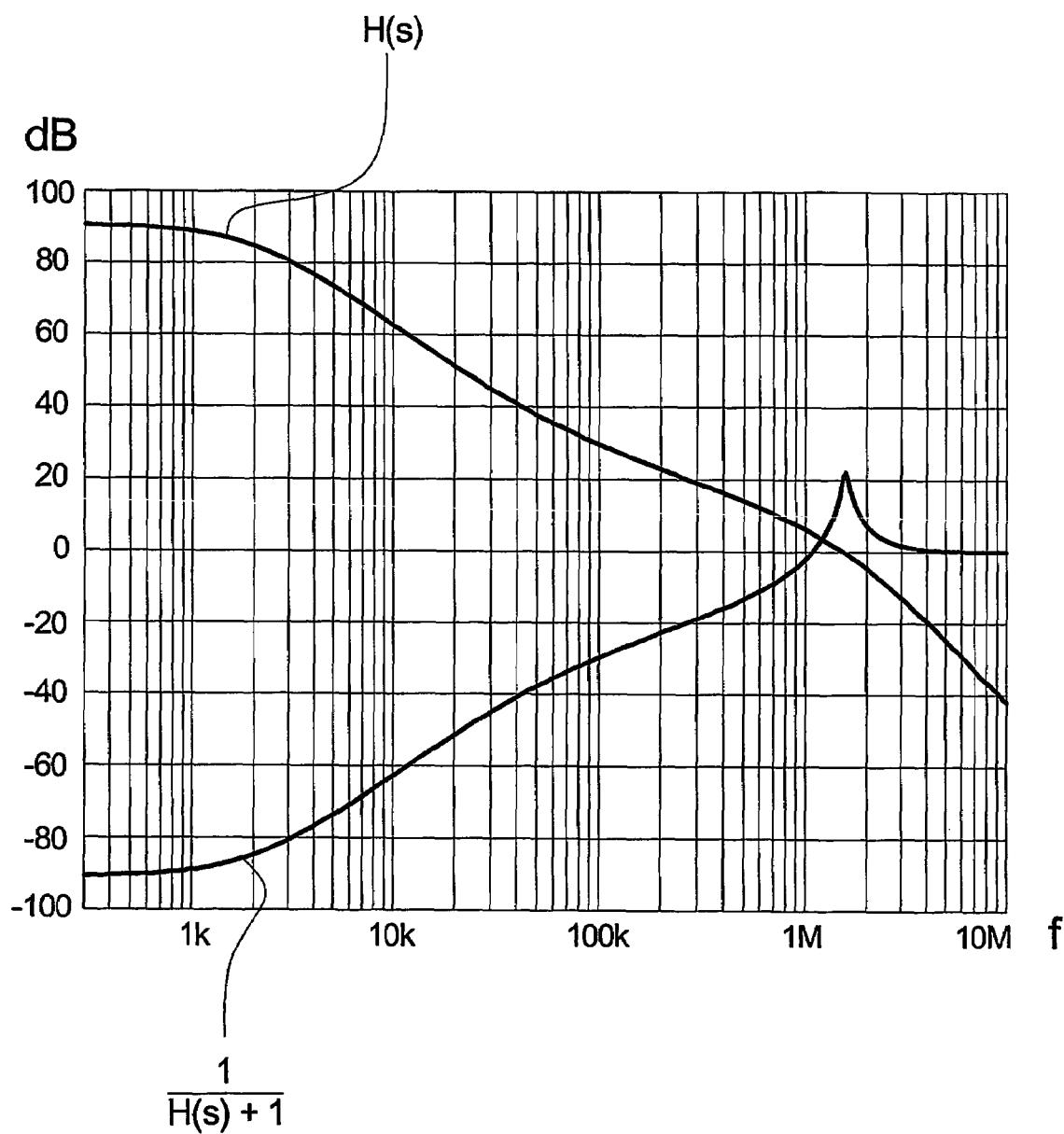
FIG. 9 illustrates two principle transfer functions illustrating the performance of the preferred embodiment of FIG. 8.

FIG. 9 illustrates two principle transfer functions illustrating the performance of the preferred embodiment of FIG. 8a.

The transfer function H(s) basically refers to a filter of an embodiment of the invention, e.g. defined primarily as indicated in most of the illustrated embodiments in the forward path, just in front of the comparator. Evidently, the resulting open-loop transfer function may be the result of further filtering means, e.g. included in the feedback path. The illustrated transfer function H(s) is designed to have a 0 dB gain at approximately −180 degrees. As mentioned earlier the switching frequency is determined by the phase of −180 degrees.

Moreover a further, and in this context very interesting transfer function is illustrated, namely the error-transfer function $1/((H(s)+1)$. This transfer function represents the advantageous properties with respect to noise induced by a time quantizer, which may in fact be obtained when including the time quantizing in the self-oscillating loop. It is noted that a significant suppression of errors originating from the time-quantizing circuit or circuits may be obtained in combination with an attractive broad-banded transfer function H(s).

Figure 10:
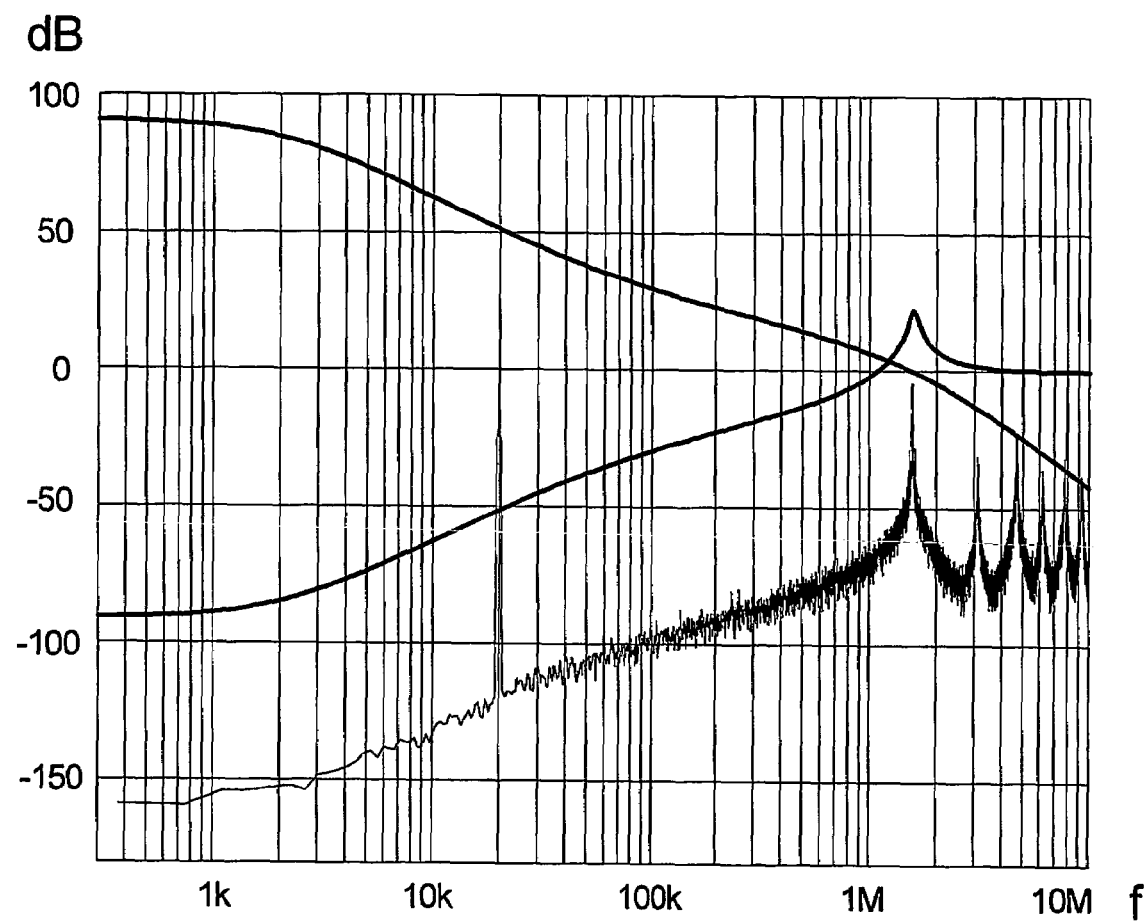
FIG. 10 illustrates the noise spectrum of the embodiment of FIG. 8.

FIG. 10 illustrates an example of a noise spectrum related to the embodiment illustrated in FIG. 8. The noise spectrum is the resulting spectrum of an example of the embodiment of FIG. 8a and 8b when an input signal of −20 dB, 20 kHz has been inputted to the converter.

It is noted that the main noise spectrum is not white any longer, when compared to the above-mentioned embodiment of FIG. 5, although peaks occur at, obviously, −20 dB, 20 kHz, representing the input signal and further peaks occur above the switching frequency at n●$f_{switch}$, where $f_{switch}$ refers to the switch frequency, here approximately 1.6 MHz+ and n refers to a number 1, 2, 3, etc.

In this embodiment, it is, however, noted that a significant improvement has been obtained compared to the noise floor resembling white noise as illustrated in FIG. 7 and the noise floor is kept below −80 dB even up to 200 kHz and higher.

The quantizing noise has thus been suppressed to a relatively large degree in the illustrated embodiment by the inclusion of the time quantizer in the self-oscillating loop and the suppression corresponds to the noise transfer function illustrated in both FIG. 9 and FIG. 10. Again, it should be noted that the illustrated noise-transfer function relates to the noise originating from the time quantizer, e.g. a latch as illustrated in FIG. 8a.

Figure 11:
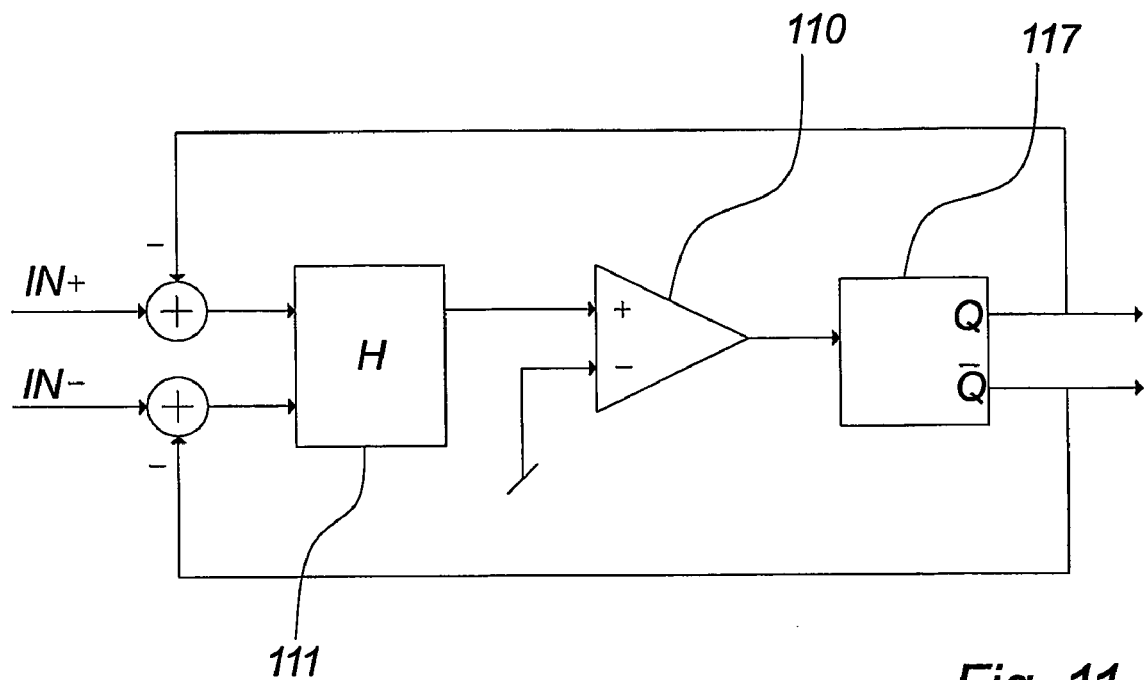
FIG. 11 illustrates a preferred differential embodiment of a self-oscillating modulator according to an embodiment of the invention.

FIG. 11 illustrates a differential embodiment of the invention of an analogue to PCM converter according to an embodiment of the invention. In this embodiment, two differential input signals IN+ and IN− are fed to a comparator 117 via filtering means 111 and the output of the comparator is then fed to a fast-running latch 110. The output of the latch Q and complement Q. Basically, this illustrated embodiment corresponds to the embodiment of FIG. 8, now only in a differential topology.

This differential embodiment of the invention is suitable in many applications, especially high-end converters.

Figure 12:
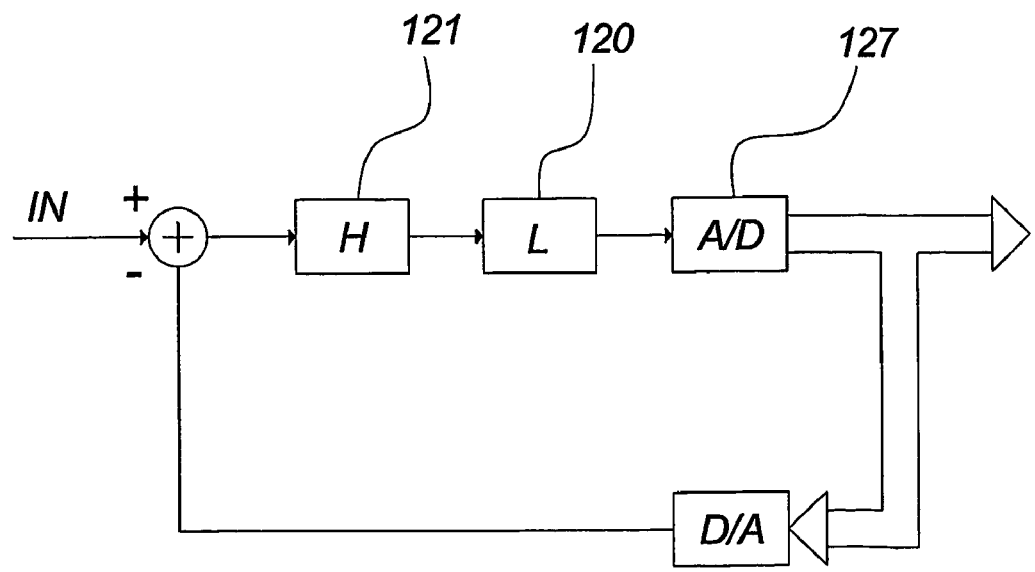
FIG. 12 illustrates a multi-bit version of a self-oscillating modulator according to an embodiment of the invention.

FIG. 12 illustrates a multi-bit version of a self-oscillating modulator according to an embodiment of the invention. Evidently, it should initially be noted that the differential version including the illustrated principle topology may be applied within the scope of the invention.

The illustrated multi-bit self-oscillating converter features an input IN connected to a multi-bit A/D converter 127 via filtering means 121 and a limiter 120. The multi-bit converter outputs a multi-bit modulated version of the input signal fed to the input of the converter on the input IN. Basically, the output version may be regarded a combined both time and amplitude quantized signal. This signal may by means of not-shown post-processing means be converted into a suitable data format if so desired.

Moreover, the output of the converter 127 is fed back to the input via a D/A converter 128 converting the output signal into a signal compatible with the input signal on IN, thereby availing the desired self-oscillating properties.

The illustrated output may e.g. comprise a multi-level signal, typically relatively few different levels in order to minimize the possible non-linearities in the obtained signal.

In this embodiment compatibility between the digital output of the modulator and the analogue input of the modulator is obtained by applying a multi-bit D/A converter in the feedback-path and thereby ensuring that the output of the modulator may be applied as feedback signal to the input. Evidently, in this embodiment a relatively fast multi-bit D/A converter should be applied for the purpose of minimizing the delay in the feedback path.

One of several alternatives of the above embodiment within the scope of the invention is to include the limiter in the A/D converter's effective transfer function.

Figure 13:
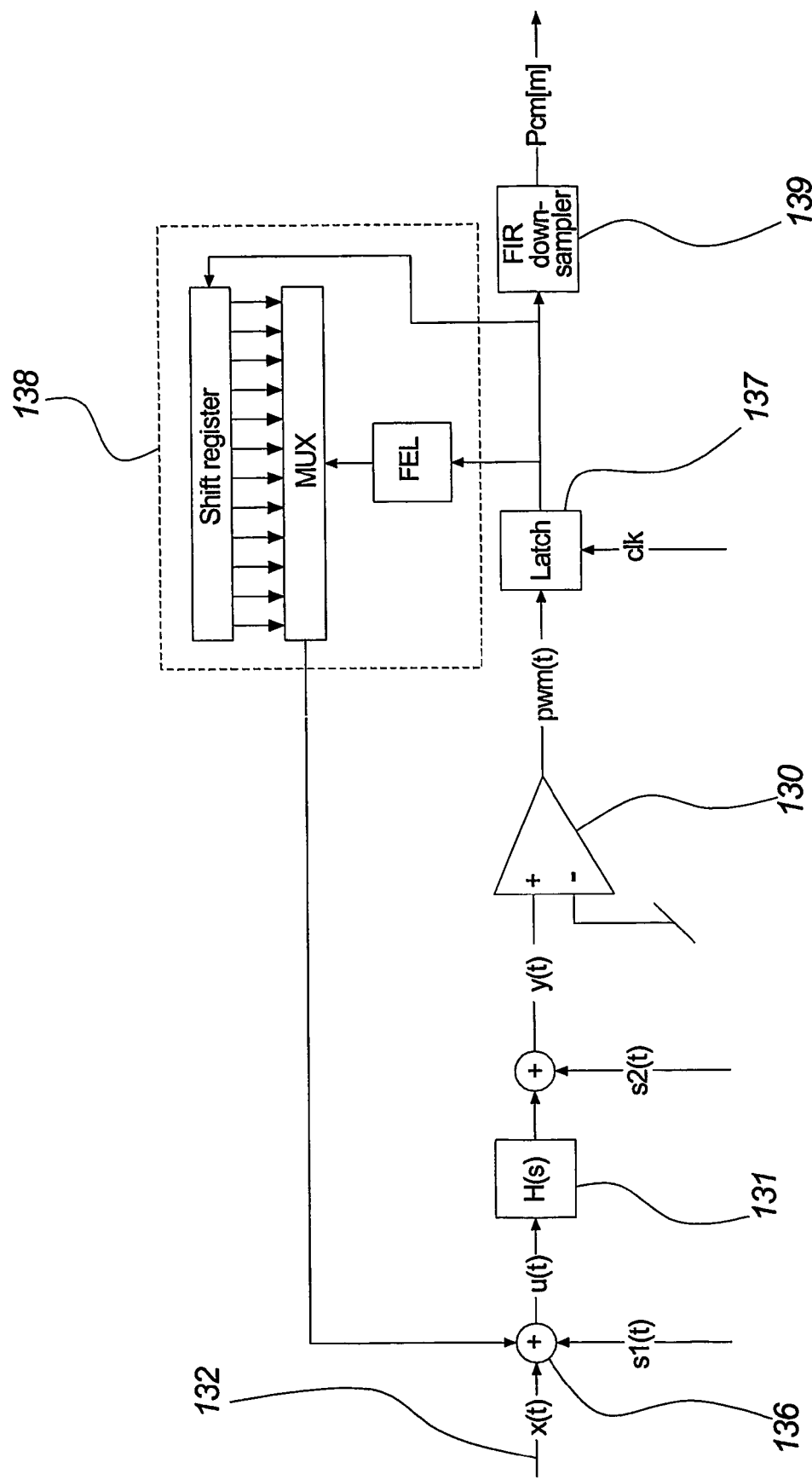
FIG. 13 illustrates an analogue to PCM converter according to an embodiment of the invention.

FIG. 13 illustrates an example of an A/D converter according to an embodiment of the invention. The illustrated converter comprises and input 132, which via a subtracting point 136 and filtering means 131 is fed to a comparator 130. The output of the comparator 130 is fed to a latch 137, which again outputs a time-quantized signal to a down sampling circuit 139 outputting a PCM down sampled signal.

In the illustrated embodiment, a feedback loop comprises means 138 for fixation of switch frequency or at least for obtaining a steady switch frequency. The self-oscillation switch frequency in this embodiment is thus basically determined by the filtering means 131 in combination with the circuit 138, which on a run-time basis monitors the output switch frequency and results in a steady switch frequency by modification of the loop delay in the self-oscillating loop. This design is basically applied for the purpose of counteracting the influence of variations of the input amplitude on the switch frequency.

Figure 14:
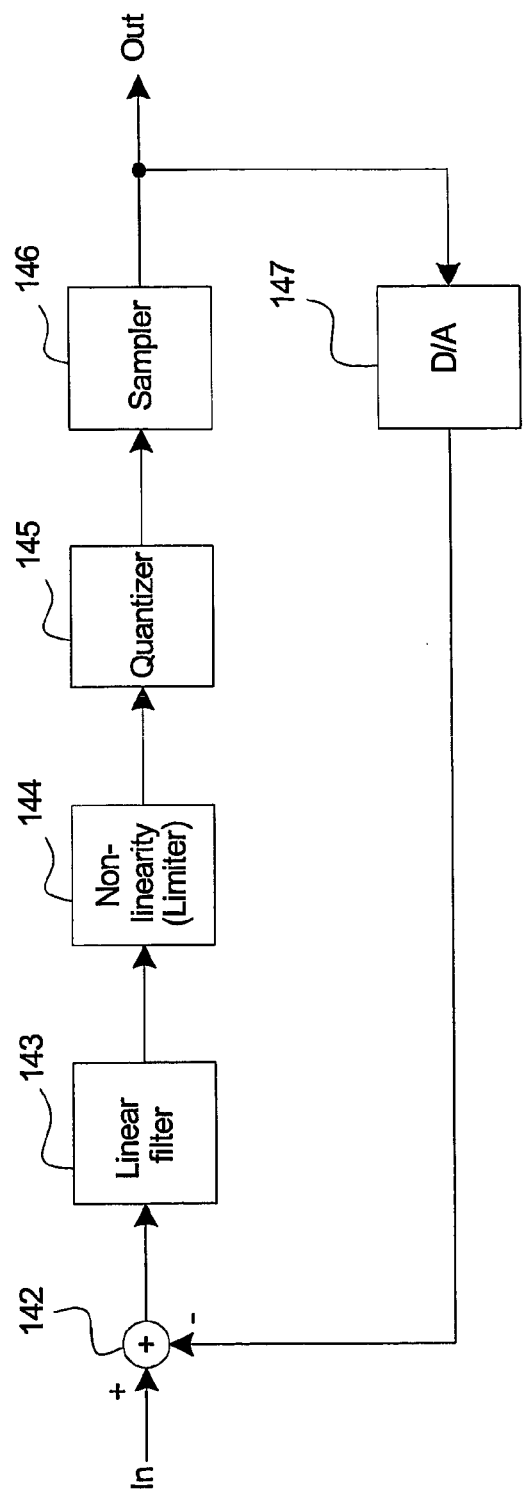
FIG. 14 illustrates the principles of a self-oscillating modulator where the time quantizer is included in the self-oscillating loop.

FIG. 14 illustrates the principles of a self-oscillating modulator where the time quantizer is included in the self-oscillating loop.

The illustrated embodiment of the invention comprises the following principal functional steps starting with an input feeding a summing point 142, elsewhere referred to a subtraction point. The output of the summing point is fed to a non-linearity, —a limiter 144 via a linear filter 143. The limiter outputs the limited, i.e. modulated, signal to a quantizer 145. The quantizer 145 quantizes the modulated signal in the amplitude domain and feeds a sampler 146 adapted for time quantizing of the signals received from quantizer 145. The time-discrete output of the sampler 146 is fed to the output of the arrangement and moreover fed back to the summing point 142 via a D/A converter 147. The D/A converter is adapted for converting the time-discrete signal into an analogue representation compatible with the input signal.

It is noted that the above-described embodiment in principle may be applied in a single or multi-bit application. In a single bit implementation, the limiter 144 and the quantizer 145 would typically comprise one single comparator providing both the desired non-linearity and the desired, i.e. two levels, quantizing level. In such an embodiment, the D/A converter in the feedback path of the oscillator may be omitted as the desired analogue signal for the feedback path is in principle provided by the hold-circuit of the latch and may be branched back to the summing point as an analogue signal, whereas a digital signal is output for further processing. An example of such topology is illustrated in FIG. 8.

Figure 15:
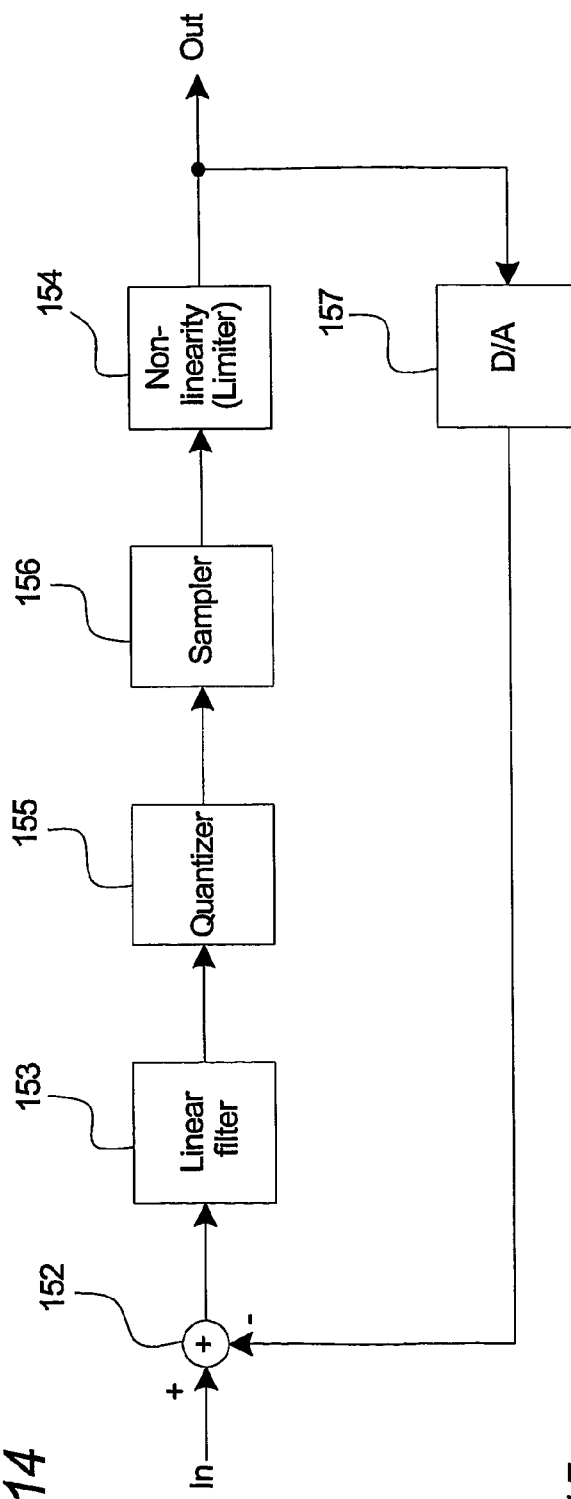
FIG. 15 illustrates an embodiment of the invention where the non-linearity is arranged in the digital domain.

FIG. 15 illustrates an embodiment of the invention where the non-linearity is arranged in the digital domain.

The illustrated embodiment of the invention comprises the following principal functional steps starting with an input IN feeding a summing point 152. The output of the summing point is led to a quantizer 155 via a linear filter 153. The quantizer 155 quantizes the filtered signal and feeds a sampler 156 adapted for time quantizing of the signals received from quantizer 155. The time-quantized signal is then fed to a non-linearity 154, i.e. a limiter. The limiter outputs the limited, i.e. modulated, signal to the output of the circuit and moreover feeds a signal back to the summing point 152 via a D/A converter 157. The D/A converter is adapted for converting the time-discrete signal into an analogue representation compatible with the input signal.

Basically, this topology involves the same process steps as the above described, now with the difference that the limiter 154 is included in the digital domain. In other words, the non-linearity is now defining the desired modulation subsequent to the time quantizing of the signal.

Figure 16:
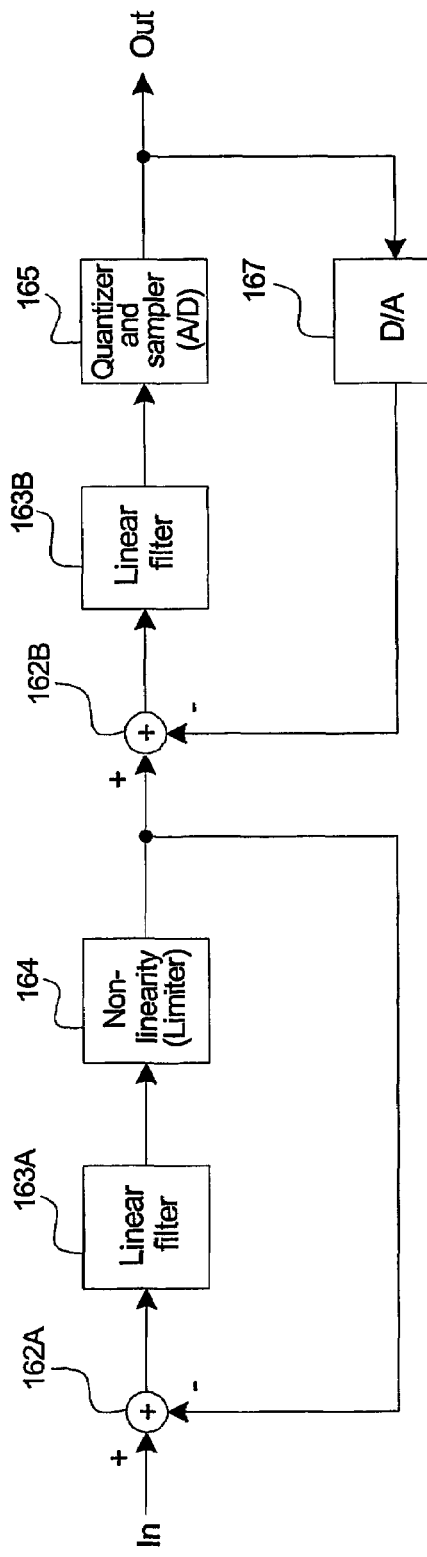
FIG. 16 illustrates an embodiment of the invention where the non-linearity is included in a self-oscillating loop and cascaded with a subsequent time and amplitude quantizer comprising a noise shaper.

FIG. 16 illustrates an embodiment of the invention where the non-linearity is included in an amplitude quantizing self-oscillating loop and cascaded with a subsequent time quantizer comprising a noise shaper.

The illustrated embodiment of the invention comprises the following principal functional steps starting with an input IN feeding a summing point 162A. The output of the summing point 162A is led to a limiter 164 via a linear filter 163A The analogue output, a PWM signal, of the limier 164 is moreover fed directly back to the summing point 162A. This first stage of the circuit forms a self-oscillating modulator.

Moreover, the output of the limiter is fed a quantizer/sampler 165 via a summing point 162B and a linear filter 163B. The time-discrete output of the quantizer/sampler 165 is fed to the output Out of the circuit and is moreover fed back to the summing point 162B via a D/A converter 167. The D/A converter 167 is adapted for converting the time-discrete signal into an analogue representation compatible with the signal received on the input of the summing point 162B from the limiter 164.

Basically, this embodiment differs from the above-described embodiments of FIG. 14 and 15 in the sense that the initial amplitude quantizing and the subsequent time quantizing have now been separated. Hence, the amplitude quantizing is included in the self-oscillating loop 162A, 163A and 164 while the subsequent time quantizing is handled with respect to time-quantizing error in a more conventional way by means of noise shaping.

The benefit of this embodiment is basically, that the filter 163B may be optimized for noise-shaping purposes.

Figure 17:
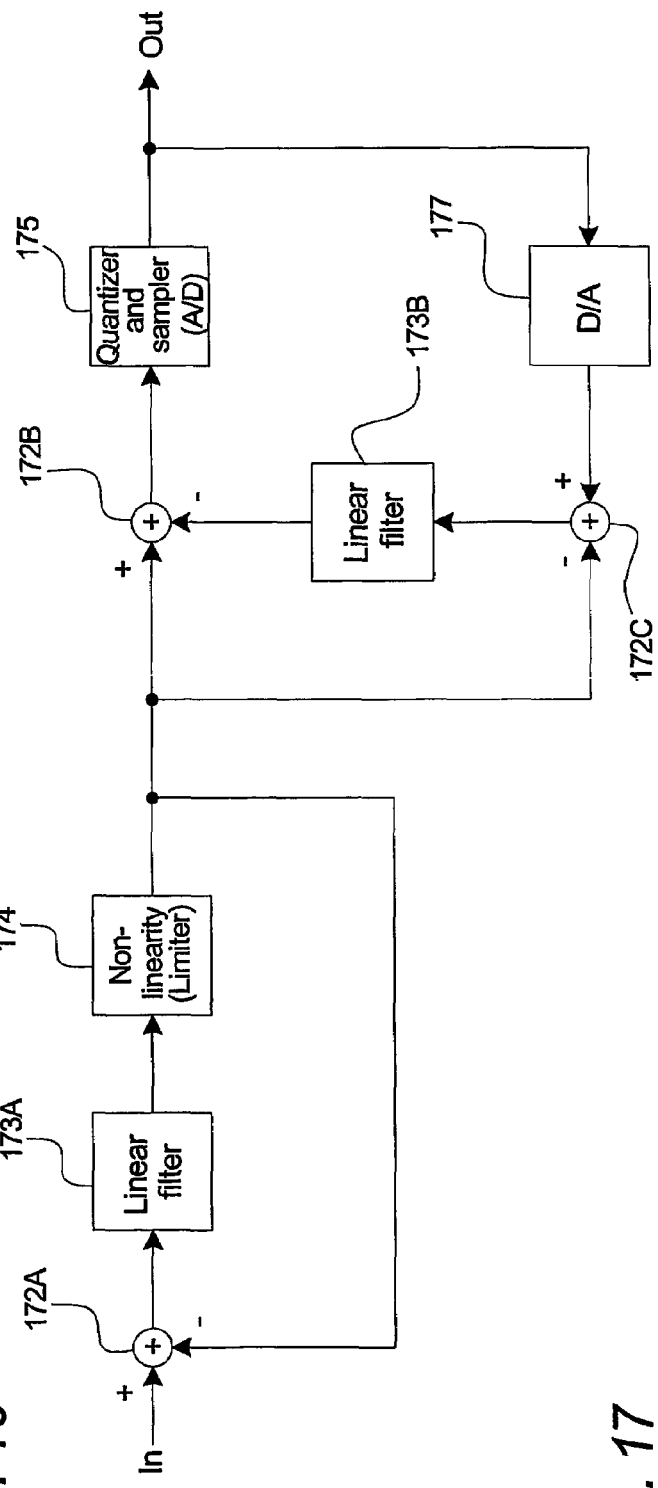
FIG. 17 illustrates an embodiment of the invention corresponding to FIG. 16 but where only the quantizing error resulting from the time quantizer is filtered.

FIG. 17 illustrates an embodiment of the invention corresponding to FIG. 16 but where only the quantizing error resulting from the time quantizer is filtered in the time-quantizing stage.

The illustrated embodiment of the invention comprises the following principal functional steps starting with an input IN feeding a summing point 172A. The output of the summing point 172A is led to a limiter 174 via a linear filter 173A. The analogue output, a PWM signal, of the limiter 174 is moreover fed directly back to the summing point 172A. This first stage of the circuit forms a self-oscillating modulator.

Moreover, the output of the limiter is fed a quantizer/sampler 175 via a second summing point 172B. The time-discrete output of the quantizer/sampler 175 is fed to the output Out of the circuit and is moreover fed back to a third summing point 172C via a D/A converter 177. The D/A converter 177 is adapted for converting the time-discrete signal into an analogue representation compatible with the signal received on the input of the summing point 172C from the limiter 174. Moreover, a linear filter 173B is inserted between the output of the summing point 172C and a further input of the summing point 172B.

It is noted that the noise shaper in the second modulator stage, i.e. the time-quantizing stage, is slightly different from that of FIG. 16, thereby offering another variation of a time noise-shaping characteristic. This variation may, as noted above, be established independent of stage 1, i.e. the amplitude quantizer.

Moreover, it should be noted that stage one of both the above-described embodiments establishes the desired self-oscillation modulation technique, whereas stage two, which is typically not-self-oscillating deals with the time quantizer noise separately within influencing the operation of stage one in other ways than the simple additive function.

FIG. 18 illustrates a further embodiment of the invention where the time-quantizing error is fed back to the amplitude self-oscillating loop.

The illustrated embodiment of the invention comprises the following principal functional steps starting with an input feeding a summing point 182A. The output of the summing point is fed to a limiter 184 via a linear filter 183A. The limiter outputs the limited, i.e. modulated, signal to a quantizer 185. The quantizer 185 quantizes the modulated signal in the amplitude domain and feeds a sampler 186 adapted for time quantizing of the signals received from quantizer 185. The time-discrete output of the sampler 186 is fed to the output of the arrangement and moreover fed back to a second summing point 182B via a D/A converter 187. The D/A converter is adapted for converting the time-discrete signal into an analogue representation compatible with the input signal of the summing point 182B received from the output of the limiter 184. The output of the summing point 182B is moreover fed back to the summing point 182A via a second linear filter 183A.

A further feedback is established from the output of the limiter 184 to the summing point 182A basically forming a self-oscillating/modulating loop, whereas the other loop, the below loop, forms a quantizing error correcting feedback loop according to conventional feedback principles, i.e. substantially non-oscillating.

Basically, the above loop, i.e. the loop comprising the linear filter 183A, the limiter 184 and the feedback to the summing point 182A typically forms the desired self-oscillating modulator, whereas the quantizer 185 and the sampler 186 in a more simple way form a circuit by means of the "below" feedback "line" 187, 183B connected to the summing points 182B and 182A facilitate a more conventional feedback of the time quantizing noise. It is noted that the time-quantizing noise of the combined quantizer 185 and sampler 186 may in fact be fed back effectively to the summing 182A, thereby availing a certain degree of time-quantizing noise suppression by means of the self-oscillating stage one.

FIG. 19 illustrates a further topology of feeding the time-quantizing error back to the amplitude self-oscillating loop.

The illustrated embodiment of the invention comprises the following principal functional steps starting with an input feeding a summing point 192A. The output of the summing point is fed to a limiter 194 via a linear filter 193A and a second summing point 192B. The limiter outputs the limited, i.e. modulated, signal to a quantizer 195. The quantizer 195 quantizes the modulated signal in the amplitude domain and feeds a sampler 196 adapted for time quantizing of the signals received from quantizer 195. The time-discrete output of the sampler 196 is fed to the output of the arrangement and moreover fed back to a third summing point 192C via a D/A converter 197. The D/A converter is adapted for converting the time-discrete signal into an analogue representation compatible with the input signal of the summing point 192C received from the output of the limiter 194. The output of the third summing point 192C is moreover fed back to the second summing point 192B via a second linear filter 193B.

A further feedback is established from the output of the limiter 194 to the summing point 192A basically forming a self-oscillating/modulating loop, whereas the other loop, the below, forms a quantizing error-correcting feedback loop according to conventional feedback principles, i.e. substantially non-oscillating.

Basically, the above loop benefits from a separate handling of the time-quantizing signal from the sampler 196 and the input due to the different filters 193A and 193B.

FIG. 20-23 illustrate examples of non-linearities, limiters applied in the self-oscillating loop(s) according to embodiment of the invention.

Figure 20:
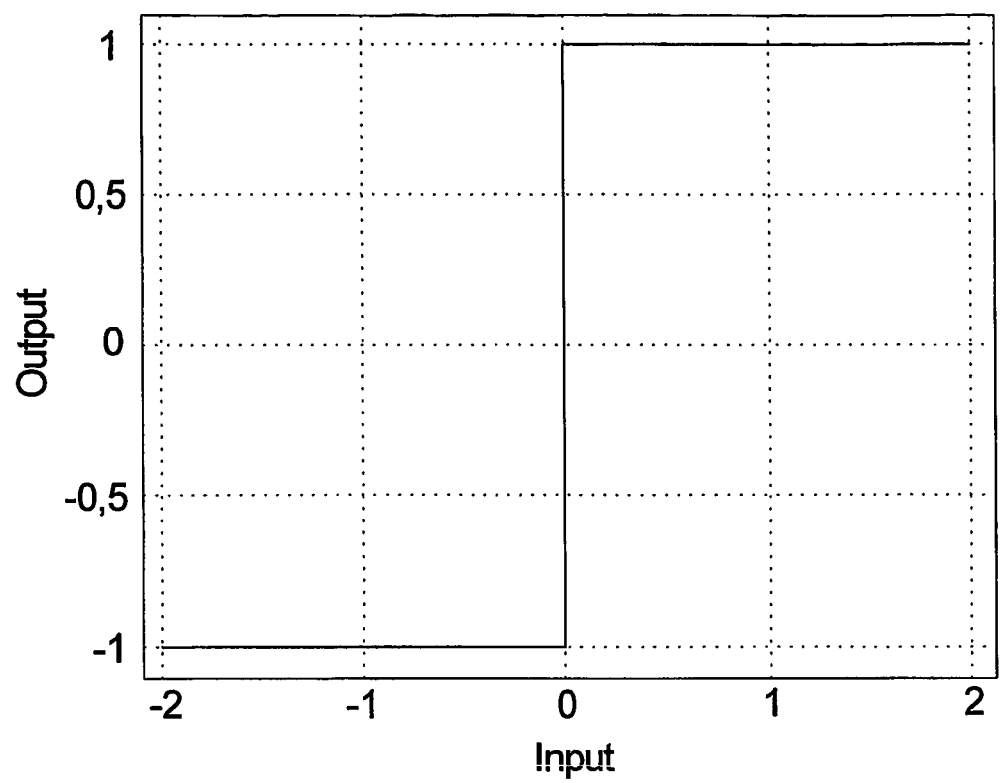
FIG. 20-23 illustrate examples of non-linearities applied in the self-oscillating loop(s) according to an embodiment of the invention.
Figure 21:
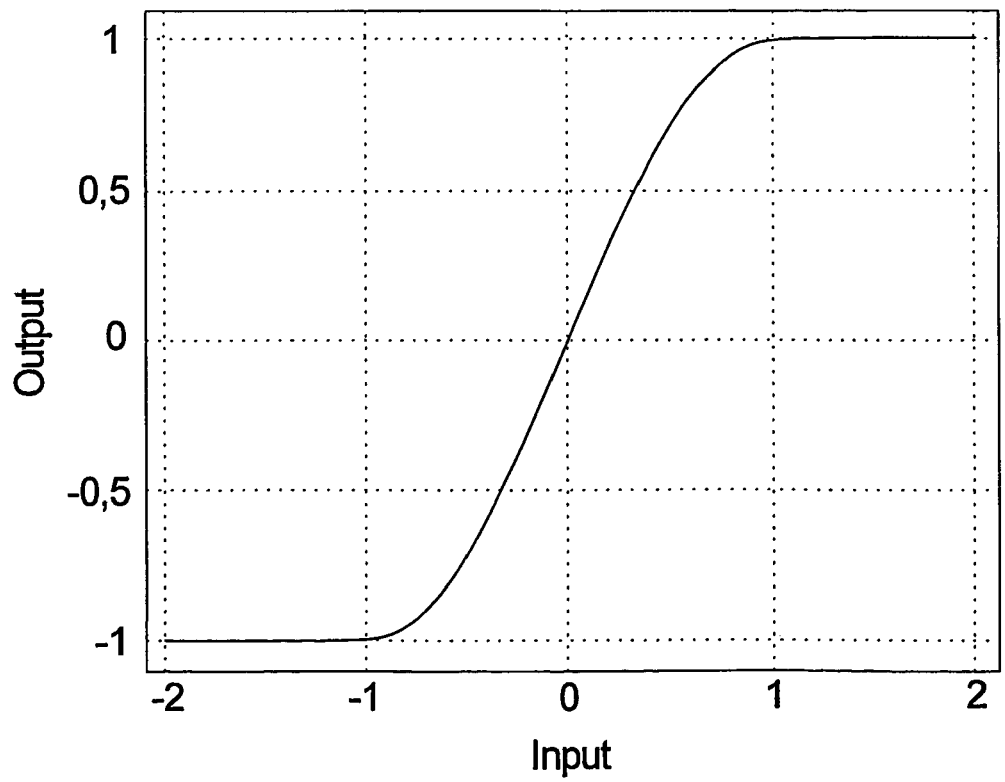
Figure 22:
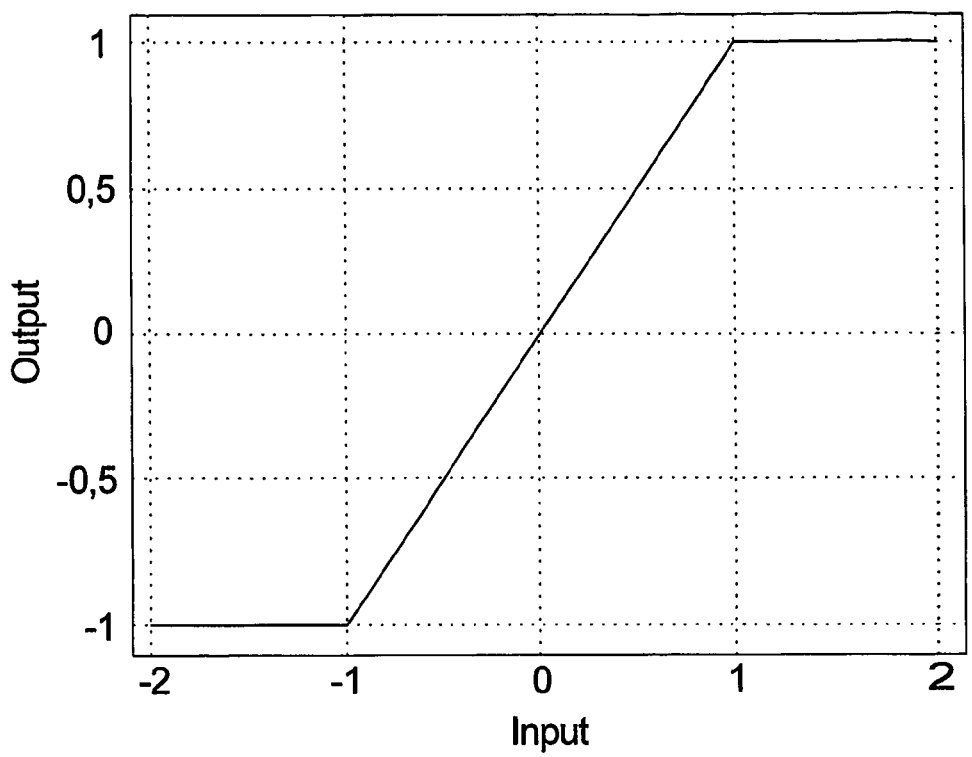
Figure 23:
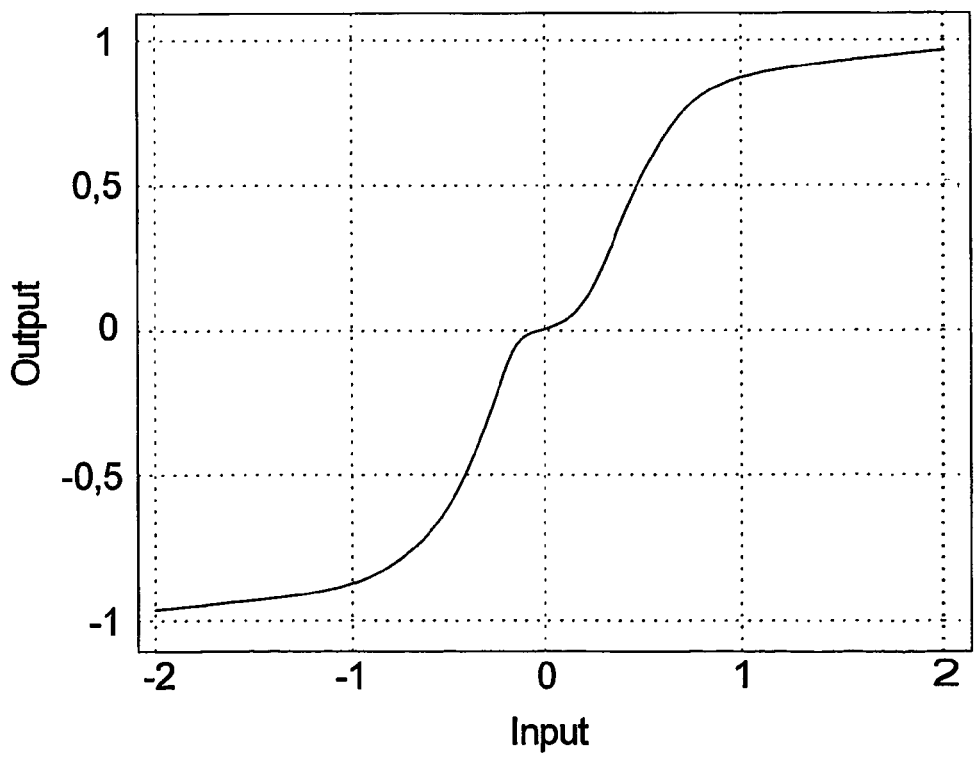

It is noted that the applicable limiter transfer functions may vary significantly within the scope of the invention, from the hard-clipper of FIG. 20, to the more soft-clipping limiters of FIG. 21, 22 and 23. The soft-clipping limiters may advantageously be combined with multi-bit PWM quantizers as the transition between one clip and the opposite may be more detailed described. This feature will be illustrated below.

According to the invention, a non-linearity is required for obtaining the desired combination of oscillation and modulation as obtained by self-oscillating modulators. Note that the soft-clipping arrangement is also regarded as a limiter, although the illustrated two clipping levels are basically only reached at infinite. Evidently, several other limiter characteristics may be applied within the scope of the invention.

Figure 24:
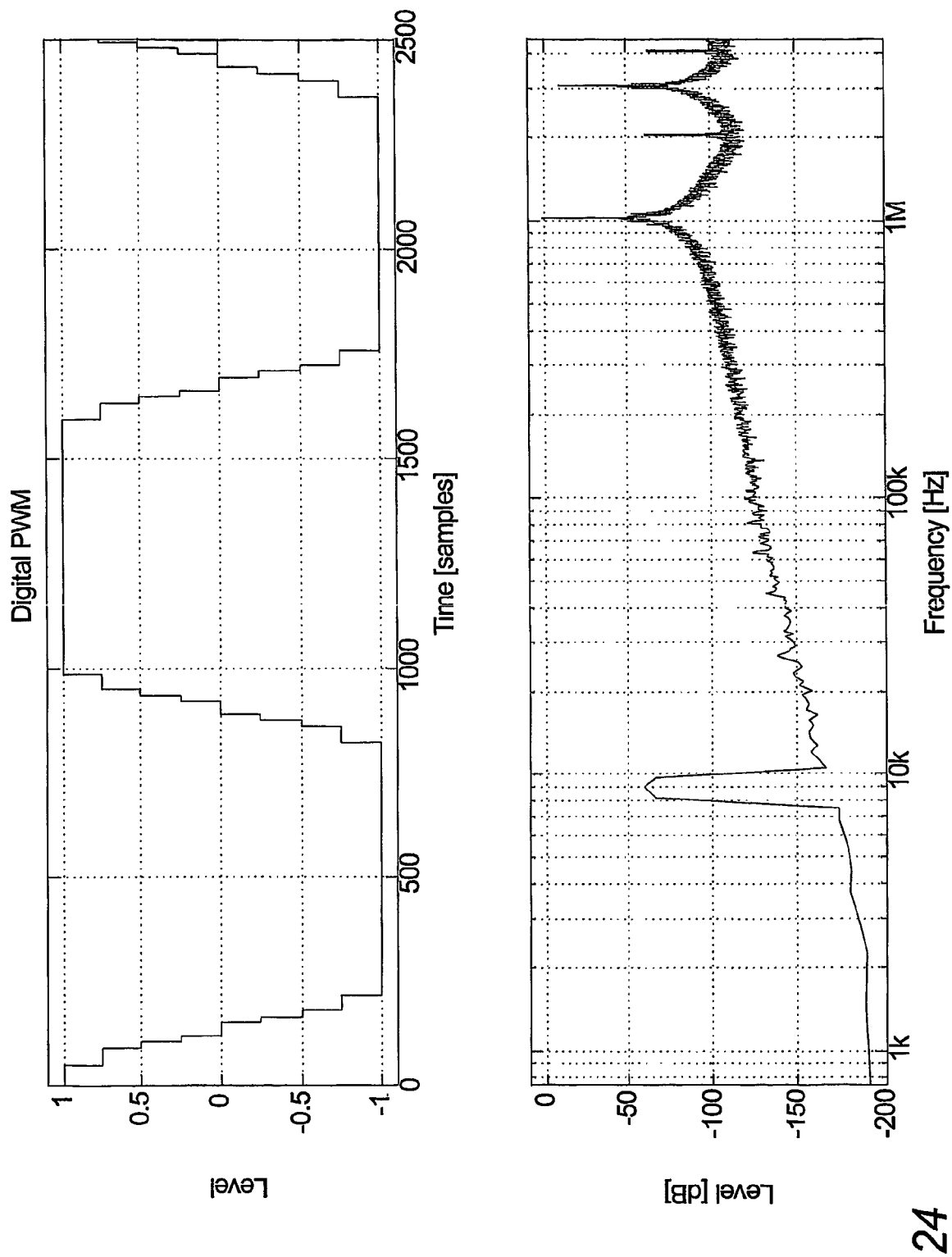
FIG. 24 illustrates the characteristics of a seven-level digital pulse width modulator and where

FIG. 24 illustrates the characteristics of a seven-level digital PWM modulator according to an embodiment of the invention. The illustrated embodiment shows an exemplary seven-level PWM modulation signal as a function of time when a 9 kHz sinusoidal signal is input to the A/D converter.

Switch-frequency components are observed at n times 1 MHz, where n=1, 2, 3, 4, etc.

Figure 25:
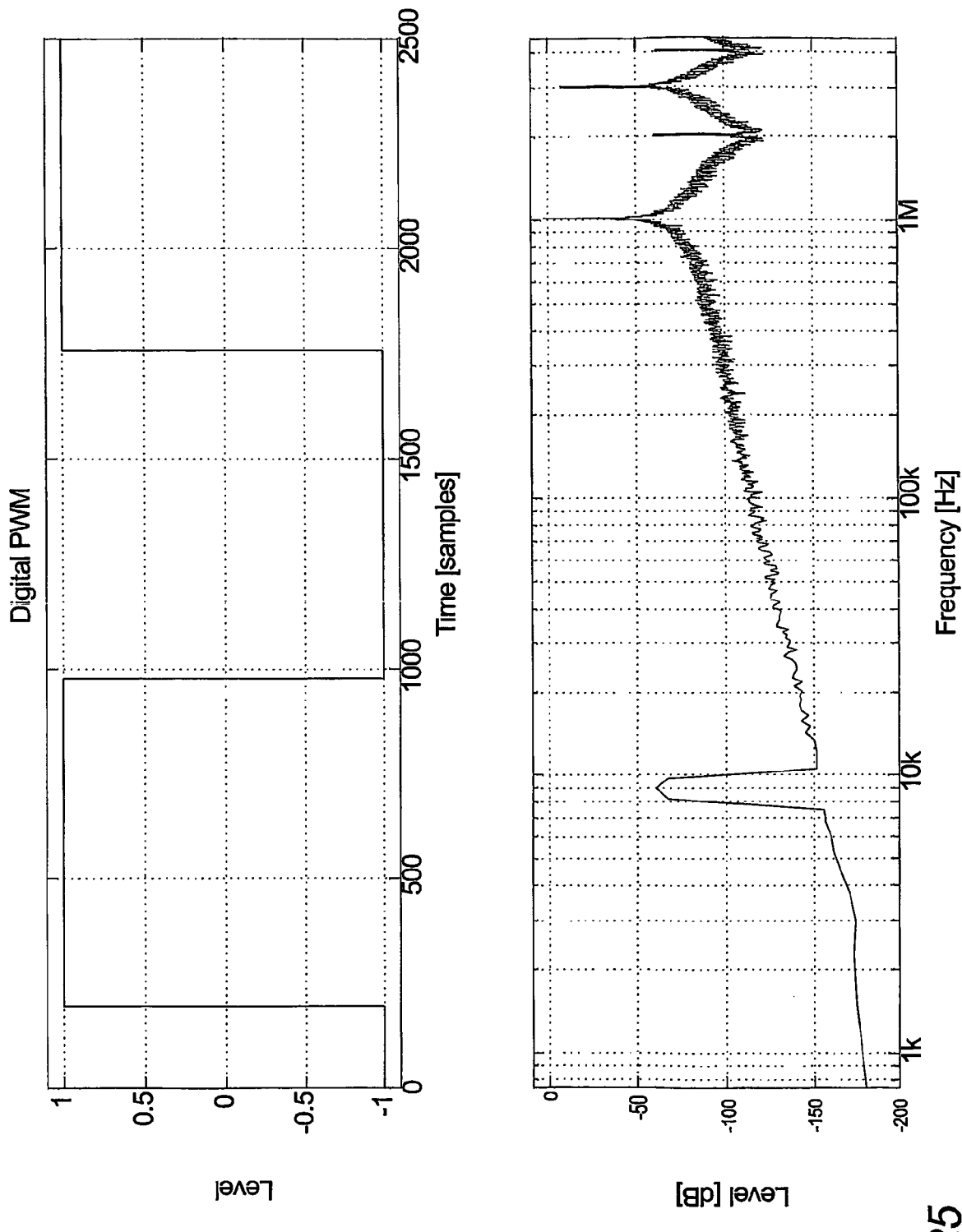
FIG. 25 illustrates the characteristics of a two-level digital pulse width modulator.

FIG. 25 illustrates the characteristics of a two-level digital PWM modulator according to an embodiment of the invention. The illustrated embodiment shows an exemplary two-level PWM modulation signal as a function of time when a 9 kHz sinusoidal signal is input to the A/D converter. The improved suppression of noise in the utility band as observed in connection with FIG. 8a is also noted in this connection.

It is noted that the seven-level PWM modulator benefits from an improved noise suppression compared to the two-level embodiment and the noise floor is thus 20 dB lower than two-level within the utility band, here 0 to 20 kHz. The noise suppression obtained by multi-level PWM is thus significant, although the method requires a high-speed and high-quality D/A converter in the self-oscillating loop.

Variants within the scope of the invention include the use of more than one feedback for the purpose of establishing the desired self-oscillating properties, i.e. a PWM modulation of an input signal. Further variations of the invention include the use of a switch frequency stabilizing circuits, e.g. variable references applied for the purpose of fixing the switch-frequency within a tolerable interval.

Further variants within the scope of the invention may include, but are not limited to, the inclusion of further circuitry, such as oscillators, power supplies, etc, in the A/D-converter.

The invention claimed is:

1. A/D converter comprising a self oscillating modulator, said converter comprising
   at least one self-oscillating loop comprising
   at least one forward path,
   at least one feedback path,
   wherein said at least one forward path comprising amplitude quantizing means combined with time quantizing means and outputting at least one time and amplitude quantized signal;
   wherein said amplitude quantizing means and said time quantizing means comprises a multi-bit A/D converter and where said feedback path comprises at least one D/A converter adapted for converting said time quantized signal into an analogue signal.

2. A/D converter comprising a self-oscillating modulator, said
   converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein down sampling means are connected to said time quantizing means.

3. A/D converter comprising a self-oscillating modulator, said converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein said A/D converter comprises two or more self oscillating loops (SOL).

4. A/D converter comprising a self-oscillating modulator, said converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein said amplitude time quantizing means comprises an analogue two-level self-oscillating pulse width modulator.

5. A/D converter comprising a self-oscillating modulator, said converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein said amplitude time quantizing means comprises a multi-level self-oscillating pulse width modulator.

6. A/D converter comprising a self-oscillating modulator, said converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein said A/D converter is differential.

7. A/D converter comprising a self-oscillating modulator, said converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein said A/D converter comprises filtering means, said filtering means adapted for band pass filtering the time quantized signal.

8. A/D converter comprising a self-oscillating modulator, said converter comprising
   at least one self-oscillating loop comprising
   at least one forward path,
   at least one feedback path,
   wherein said at least one forward path comprises amplitude quantizing means combined with time quantizing means and outputting at least one time and amplitude quantized signal;
   wherein an error originating from at least one time quantizer included in the at least one self-oscillating loop of the converter is suppressed by an error transfer function which, at low frequencies approximates an inverse of an open-loop transfer function of said at least one self-oscillating loop.

9. A/D converter comprising a self-oscillating modulator, said converter comprising at least one self-oscillating loop comprising
at least one forward path,
at least one feedback path,
wherein said at least one forward path comprises amplitude quantizing means combined with time quantizing means and outputting at least one time and amplitude quantized signal;
wherein an error originating from at least one time quantizer included in the at least one self-oscillating loop of the converter is suppressed by an error transfer function which, at high frequencies approximates 0 dB.

10. A/D converter comprising a self-oscillating modulator, said converter comprising
at least one self-oscillating loop comprising
at least one forward path,
at least one feedback path,
wherein said at least one forward path comprising amplitude quantizing means combined with time quantizing means and outputting at least one time and amplitude quantized signal;
wherein said amplitude quantizing means comprises a limiter.

11. A/D converter comprising a self-oscillating modulator, said converter comprising
at least one self-oscillating loop comprising
at least one forward path,
at least one feedback path,
wherein said at least one forward path comprises amplitude quantizing means combined with time quantizing means and outputting at least one time and amplitude quantized signal;
wherein said amplitude quantizing means comprises a frequency compensated limiter.

12. A/D converter comprising a self-oscillating modulator, said converter comprising
at least one self-oscillating loop comprising
at least one forward path,
at least one feedback path,
wherein said at least one forward path comprises amplitude quantizing means combined with time quantizing means and outputting at least one time and amplitude quantized signal;
wherein a variable self-oscillating loop delay is applied.

13. A/D converter comprising a self-oscillating modulator, said converter comprising
at least one self-oscillating loop comprising
at least one forward path,
at least one feedback path,
wherein said at least one forward path comprises amplitude quantizing means combined with time quantizing means and outputting at least one time and amplitude quantized signal; and
further comprising a variable delay in the feedback path.

14. A/D converter comprising a self-oscillating modulator, said converter comprising
at least one self-oscillating loop comprising
at least one forward path,
at least one feedback path,
wherein said at least one forward path comprises amplitude quantizing means combined with time quantizing means and outputting at least one time and amplitude quantized signal;
wherein a transfer function H(s) is inserted in the forward path, thereby at least partly controlling a switch-frequency.

* * * * *

UNITED STATES PATENT AND TRADEMARK OFFICE
CERTIFICATE OF CORRECTION

PATENT NO. : 7,379,001 B2
APPLICATION NO. : 10/573059
DATED : May 27, 2008
INVENTOR(S) : Pedersen et al.

It is certified that error appears in the above-identified patent and that said Letters Patent is hereby corrected as shown below:

Title Page Item (73), Assignee, delete "TC Electric A/S (DK)" and insert therefor --TC Electronic A/S, Denmark--.

Signed and Sealed this
Third Day of March, 2015

Michelle K. Lee
*Deputy Director of the United States Patent and Trademark Office*